United States Patent
Shirakami et al.

(10) Patent No.: US 8,456,839 B2
(45) Date of Patent: Jun. 4, 2013

(54) COOLING STRUCTURE FOR HOUSING DEVICE

(75) Inventors: Takashi Shirakami, Kawasaki (JP); Tetsuya Murayama, Kanagawa (JP); Kazuhiro Iino, Kawasaki (JP); Yoshiaki Tada, Kawasaki (JP); Yusuke Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 292 days.

(21) Appl. No.: 13/064,551

(22) Filed: Mar. 30, 2011

(65) Prior Publication Data

US 2011/0317360 A1 Dec. 29, 2011

(30) Foreign Application Priority Data

Jun. 24, 2010 (JP) ................................ 2010-143622

(51) Int. Cl.
*H05K 7/20* (2006.01)
(52) U.S. Cl.
USPC ............ 361/692; 361/690; 361/694; 361/695
(58) Field of Classification Search
None
See application file for complete search history.

(56) References Cited

U.S. PATENT DOCUMENTS

| | | | | |
|---|---|---|---|---|
| 6,639,794 | B2 * | 10/2003 | Olarig et al. | 361/679.48 |
| 7,259,961 | B2 * | 8/2007 | Lucero et al. | 361/695 |
| 7,394,654 | B2 * | 7/2008 | Zieman et al. | 361/695 |
| 7,688,593 | B2 * | 3/2010 | Byers et al. | 361/721 |
| 7,701,714 | B2 * | 4/2010 | Shabany | 361/698 |
| 7,813,121 | B2 * | 10/2010 | Bisson et al. | 361/679.51 |
| 8,064,200 | B1 * | 11/2011 | West et al. | 361/695 |
| 2009/0109619 | A1 * | 4/2009 | Wise et al. | 361/695 |

FOREIGN PATENT DOCUMENTS

| | | |
|---|---|---|
| JP | 56-043976 | 4/1981 |
| JP | 2-237098 | 9/1990 |
| JP | 4-16000 | 1/1992 |
| JP | 2003-163480 | 6/2003 |

OTHER PUBLICATIONS

Patent Abstracts of Japanese Publication No. 2003-163480, Published Jun. 6, 2003.
Patent Abstracts of Japanese Publication No. 4-16000, Published Jan. 21, 1992.
Patent Abstracts of Japanese Publication No. 2-237098, Published Sep. 19, 1990.

\* cited by examiner

*Primary Examiner* — Boris Chervinsky
(74) *Attorney, Agent, or Firm* — Staas & Halsey LLP

(57) ABSTRACT

With respect to a housing device having a plurality of slots in which plug-in units are mountable, division plates corresponding to the positions of the openings of the slots are put in the inside of a baffle section for changing the direction of the flow of cooling air released from the slots, and the division plates are used to divide the inside space of the baffle section into a plurality of regions corresponding to the slots, thereby reducing mutual interference of the cooling air from the slots in the baffle section and preventing a further increase in differences in the amount of passing air among the slots. Thereby, even if any difference occurs in the amount of passing air among the slots due to a structural factor, it is possible to reduce the deterioration of the cooling capacity of a slot through which relatively less amount of air passes.

14 Claims, 33 Drawing Sheets

FIG.8
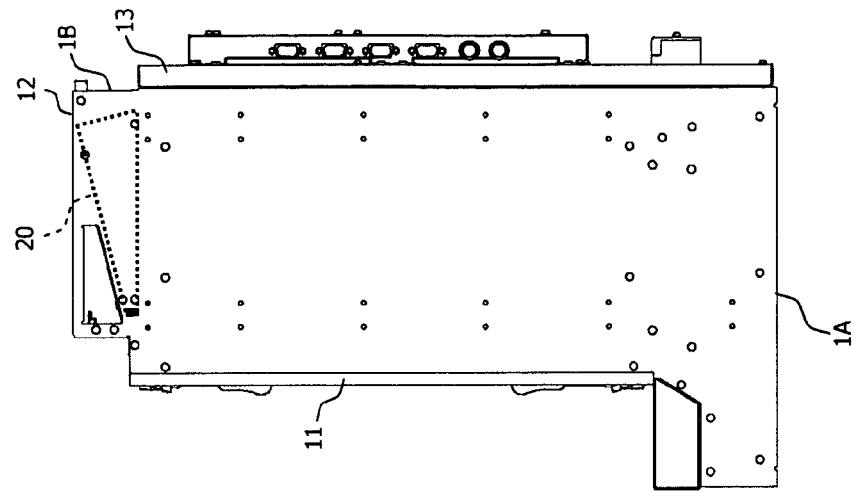
(RIGHT SIDE VIEW)
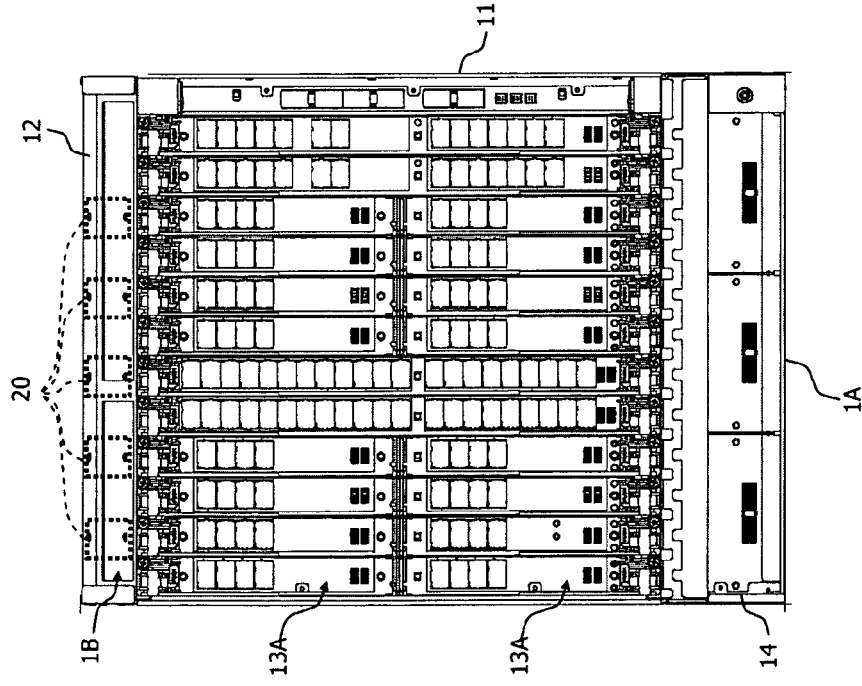
(FRONT VIEW)

STATE OF ALL PIUS BEING MOUNTED

FIG.22
(B-B CROSS SECTION)
(REAR VIEW)
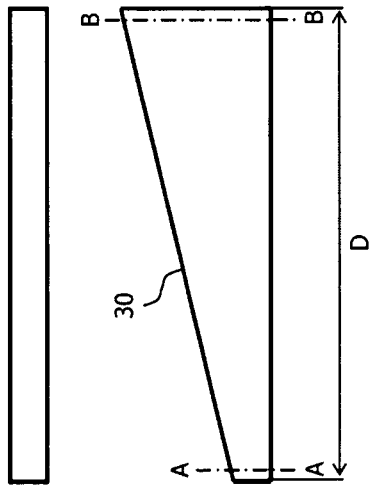
(TOP VIEW)
(SIDE VIEW)
(FRONT VIEW)
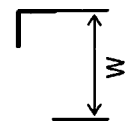
(A-A CROSS SECTION)

FIG.27
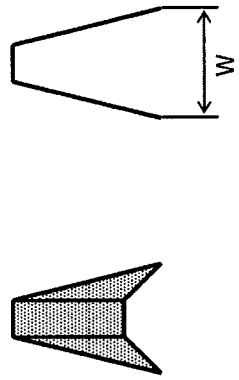
(TOP VIEW)
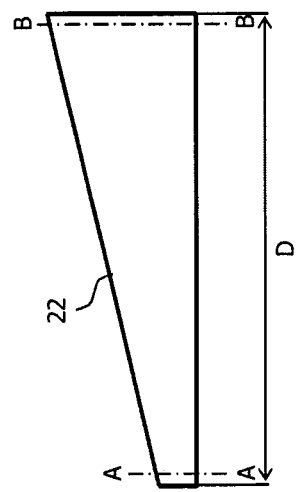
(REAR VIEW)
(B-B CROSS SECTION)
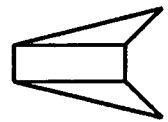
(SIDE VIEW)
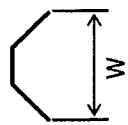
(FRONT VIEW)
(A-A CROSS SECTION)

FIG.28
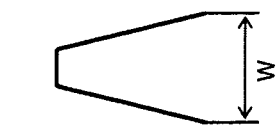
(TOP VIEW)
(SIDE VIEW)
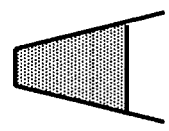
(REAR VIEW)
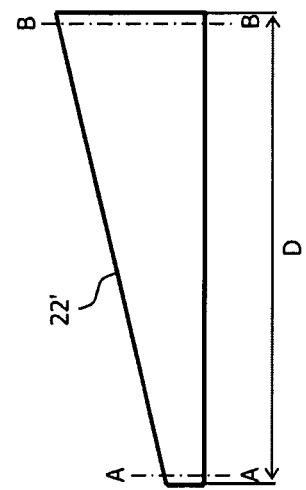
(B-B CROSS SECTION)
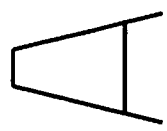
(FRONT VIEW)
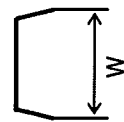
(A-A CROSS SECTION)

FIG.29
(TOP VIEW)
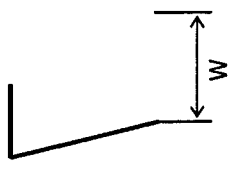
(REAR VIEW)
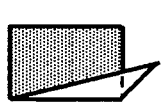
(B-B CROSS SECTION)
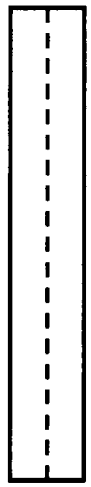
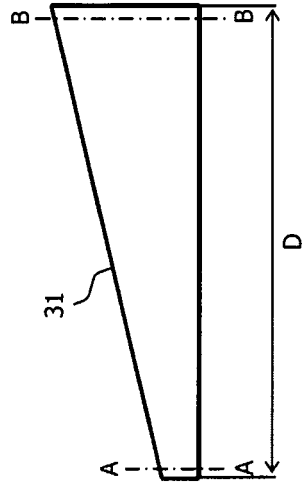
(SIDE VIEW)
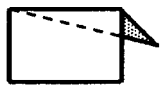
(FRONT VIEW)
(A-A CROSS SECTION)

FIG.30
(TOP VIEW)
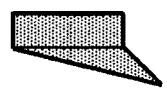
 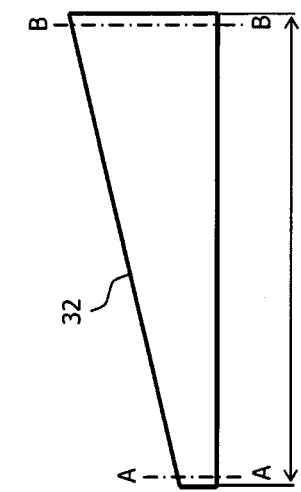
(SIDE VIEW)
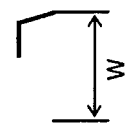
(FRONT VIEW)
(REAR VIEW)
(B-B CROSS SECTION)
(A-A CROSS SECTION)

FIG.32
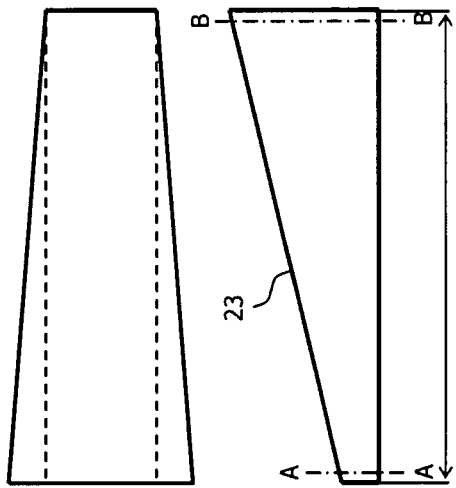
(TOP VIEW)
(SIDE VIEW)
(REAR VIEW)
(B-B CROSS SECTION)
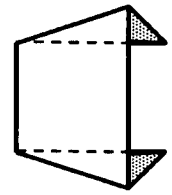
(FRONT VIEW)
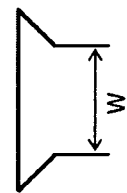
(A-A CROSS SECTION)

FIG.33
(TOP VIEW)
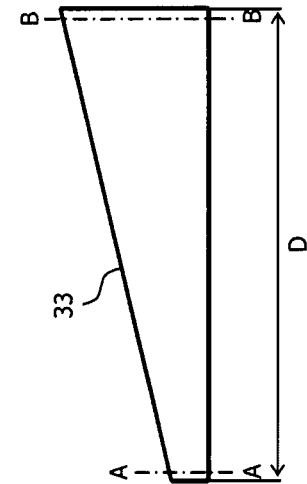
(SIDE VIEW)
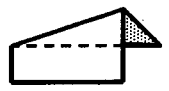
(REAR VIEW)
(FRONT VIEW)
(B-B CROSS SECTION)
(A-A CROSS SECTION)

FIG.34
STRUCTURAL EXAMPLE FOR ATTACHING DIVISION PLATE
(SIDE VIEW)
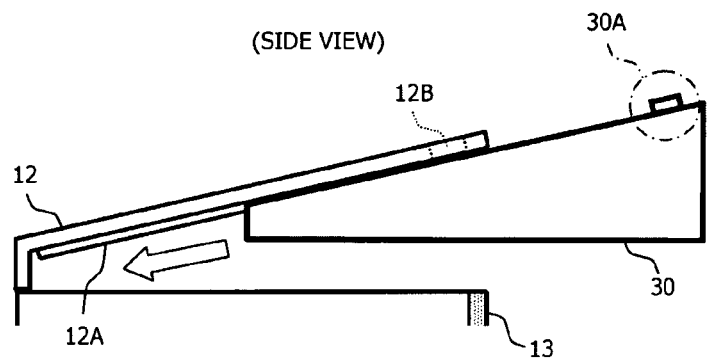
ENLARGED SECTIONAL VIEW OF RAIL ON TOP PLATE
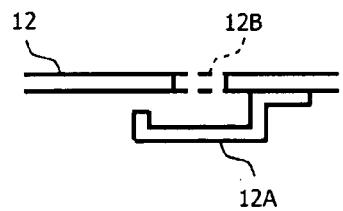
ENLARGED VIEW OF LOCK PORTION OF DIVISION PLATE
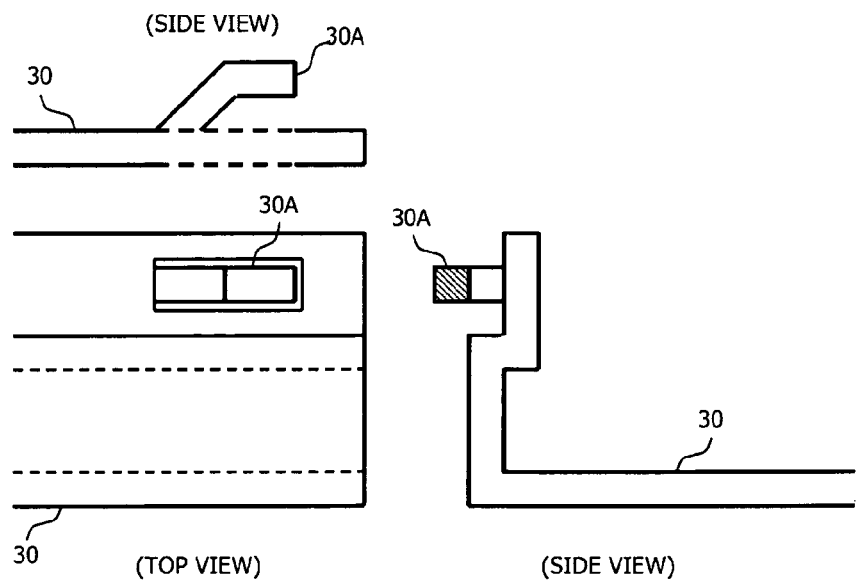
(TOP VIEW)          (SIDE VIEW)

FIG.35
(SIDE VIEW)
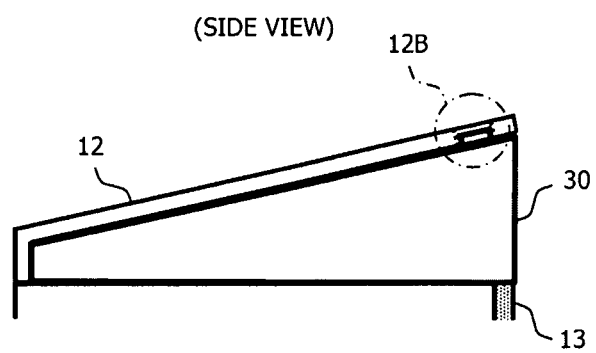
SNAP-FIT CONNECTION STATE
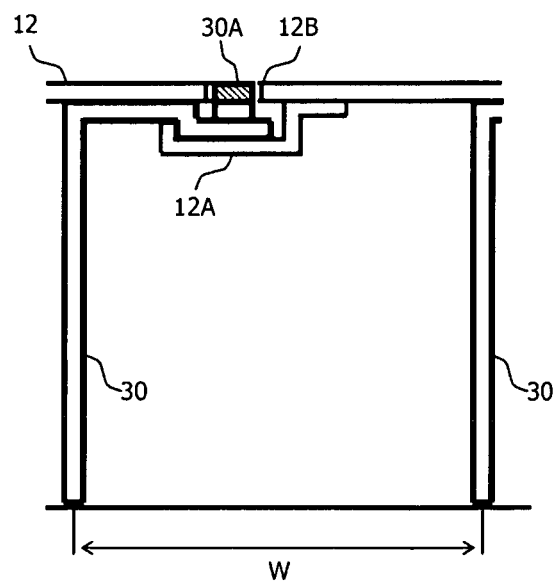

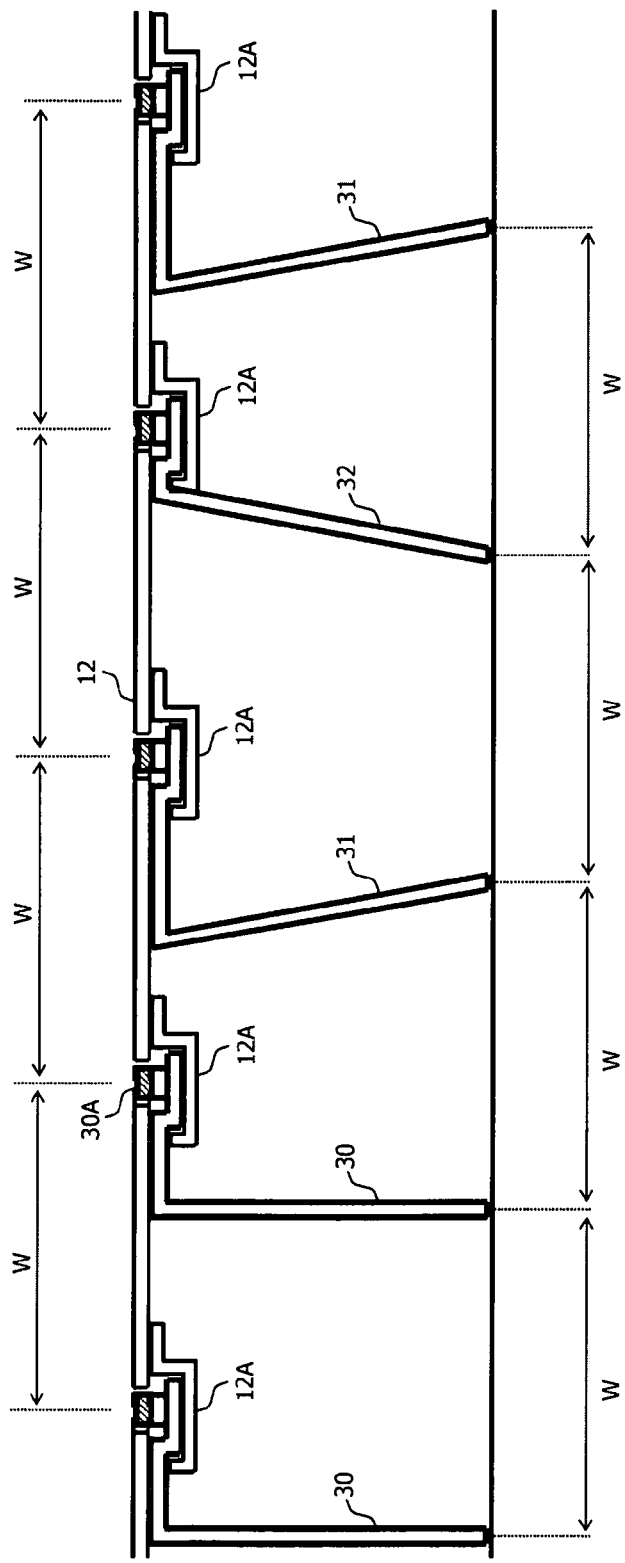

COOLING STRUCTURE FOR HOUSING DEVICE

CROSS-REFERENCE TO RELATED APPLICATION

This application is based upon and claims the benefit of priority of the prior Japanese Patent Application No. 2010-143622, filed on Jun. 24, 2010, the entire contents of which are incorporated herein by reference.

FIELD

The embodiments discussed herein are related to a cooling structure for a housing device with a plurality of slots in which plug-in units are mountable.

BACKGROUND

There is widely used a bookshelf-type housing device for housing a plurality of plug-in units (PIUs) arranged in parallel by mounting the PIUs equipped with optical modules, electronic circuits, or the like in connectors on a back wiring board (BWB). This type of housing device is often used in such a way that, for example, as illustrated in FIG. 1, a plurality of housing devices 101 and 101 are stacked in multiple stages in a rack 100 as one functional unit. In the rack 100, the temperature of the housing device 101 arranged in the upper stage rises easily under the influence of exhaust heat from the housing device 101 arranged in the lower stage. In other words, a difference occurs in cooling performance between the housing devices 101 and 101 depending on the arrangement in the rack 100. Although the housing device 101 in each stage is stored so as to occupy the full width of the rack 100 in the example of FIG. 1, a plurality of housing devices each of which is smaller in width than the housing device 101 are placed in one stage of the rack 100 in some cases.

There is known a cooling structure in which a baffle is provided for each housing device 101 to change the flow direction of cooling air which flows from the lower side to the upper side to a flow direction from the lower side to the front or rear side by using the baffle in order to reduce the difference in cooling performance in the rack 100 as described above (for example, refer to Japanese Laid-Open Utility Model Publication No. 56-43976 and Japanese Laid-Open Patent Publication No. 2003-163480). Thereby, for the housing devices 101 stacked in multiple stages, the housing device 101 in the upper stage is not directly subjected to high-temperature exhaust air (subjected to an air blow) from the housing device 101 in the lower stage, thus enabling a reduction in the deterioration of the cooling performance of the housing device 101 in the upper stage. The above baffle is also referred to as "convection inducing plate," "heat shield plate," or the like.

FIG. 2 is a perspective view illustrating a configuration example of the conventional housing device with the baffle.

In FIG. 2, the conventional housing device 101 includes a housing 111 made of metal, a baffle section 112 attached so as to cover the upper part of the housing 111, and a BWB 113 put in the backboard portion of the housing 111. In this housing device 101, cooling air taken from an air inlet located in the bottom face is discharged from an air outlet located in the upper part of the rear, as indicated by the arrow lines in FIG. 2.

FIG. 3 is a perspective view of the above conventional housing device 101 from which the top plate of the baffle section 112 is removed to enable checking of the configuration of the upper part of the housing 111 and the inside of the baffle section 112. As illustrated, on the upper part of the housing 111, there are aligned the openings of slots SL1, SL2, SL3, and so forth corresponding to a plurality of PIUs, which are mounted in the connectors on the BWB 113. Each PIU or filler panel is installed in the housing 111, by which each slot SL forms a substantially independent air flow path. The baffle section 112 is hollow. Cooling air (exhaust air) flows discharged from the openings of the slots SLs are mixed in the baffle section 112 and induced to the air outlet.

FIG. 4 is a diagram for describing the flow of the cooling air in the conventional housing device 101. As an example of a specific configuration, this specification describes a case where the housing device 101 has a push-type cooling mechanism provided with a fan unit 114 in the lower part of the housing 111 and includes a slot region 115 in which full-size PIUs are mountable and slot regions 115U and 115L in which half-size PIUs are mountable in the upper and lower two or more stages.

With fan motors $114_{F1}$ to $114_{F3}$ and $114_{B1}$ to $114_{B3}$ provided in the fan unit 114 being driven, the cooling air taken from the air inlet located in the bottom face passes through the fan unit 114 and an air plenum section 116 and is induced into the slots in the slot region 115 corresponding to the full-size PIUs and the slots in the lower-stage slot region 115L out of the slot regions 115U and 115L corresponding to the half-size PIUs, as indicated by the thick arrow lines illustrated in the side view in the upper right of FIG. 4. The cooling air, having flown from the lower side to the upper side within each slot in the slot region 115, is released into the baffle section 112. Moreover, the cooling air, having flown from the lower side to the upper side in each slot in the lower-stage slot region 115L, flows from the lower side to the upper side in the upper-stage slot region 115U in the same slot and is released into the baffle section 112. Thereafter, in the baffle section 112, the cooling air flows, having passed through the slots, are mixed with one another, and the flow of the cooling air is directed to the rear by the top plate of the baffle section 112 and then discharged to the outside from the air outlet located in the upper part of the rear.

Now, closely observing the flow of the cooling air released from the adjacent slots into the baffle section 112 in the conventional housing device as described above, the cooling air released from the slots SL1 to SL3 to the baffle section 112 smoothly flows in the baffle section 112 without mutual interference and are discharged from the air outlet to the outside as long as the same amount of air (pressure) passes through each of the adjacent slots SL1, SL2, and SL3 as illustrated in FIG. 5, in which region "a" enclosed by an alternate long and short dash line of the above FIG. 4 is enlarged.

As a practical matter, however, the same amount of air rarely passes through each of the adjacent slots SL1 to SL3 due to structural factors of the housing device, and a difference occurs in the amount of passing air depending on the slot. In other words, the conventional housing device has slot dependence in the amount of passing air.

As one of the structural factors of the housing device, there is a positional relation between the slots and the fan motors. Specifically, the amount of airflow produced by individual fan motors is low in the vicinity of the axis of rotation of the fan and high in the vicinity of the blades of the fan. In addition, a difference occurs in the amount of airflow due to individual variation of the fan motors. Therefore, in the above configuration example illustrated in FIG. 4, a difference occurs in the amount of passing air depending on the positions of the slots relative to the six fan motors $114_{F1}$ to $114_{F3}$ and $114_{B1}$ to $114_{B3}$ in the fan unit 114.

Moreover, another structural factor is a difference that occurs in whether air flows well depending on the slot according to the internal shape of the housing device, in other words, a difference in airflow resistance among the slots. For example, in the configuration of the above FIG. 4, the slot in which the half-size PIU is mountable includes many structural objects such as a rail for guiding the PIU to a predetermined position in comparison with the slot in which the full-size PIU is mountable, and therefore the airflow resistance is relatively high in the slot for the half-size PIU. Further, a difference occurs in the airflow resistance also depending on whether the PIUs are mounted in the slots or according to the structure of the PIU to be mounted.

If the slot dependence exists in the amount of passing air as described above, turbulence occurs in the flow of the cooling air in the baffle section 112. FIG. 6 specifically illustrates this situation. Similarly to FIG. 5 in the above, the arrow lines in FIG. 6 indicate the flows of cooling air and a difference in thickness of the arrow line indicates a difference in the amount of passing air (pressure). In this specification, the amount of air passing through the slot SL2 is less than the amount of air passing through each of the adjacent slots SL1 and SL3. The cooling air, having passed through each of the slots SL1 to SL3, is forcibly changed in the direction by the top plate of the baffle section 112. At this time, the cooling air from the slots SL1 and SL3 through each of which more amount of air passes (higher in pressure) flows into the region on the slot SL2 side where less amount of air flows (lower in pressure), thereby obstructing the flow of cooling air from the slot SL2 to the baffle section 112. The turbulence of the cooling air in the baffle section 112 further increases the slot dependence in the amount of passing air which is caused by the structural factors of the housing device. This is likely to notably decrease the amount of air passing through the slot SL2 and to reduce the cooling capacity problematically.

Moreover, the effect of the turbulence of the cooling air in the baffle section as described above is more obvious when a large bias occurs in the amount air passing through each slot such as in the case of a trouble or replacement of any of the fan motors or replacement of any of the PIUs. The limit in cooling performance of the housing device depends on the slot through which the least amount of air passes among the plurality of slots. Therefore, the higher the slot dependence in the amount of passing air, the lower the cooling performance of the entire housing device. This makes it difficult to design the device. Moreover, the amount of air passing through the corresponding slot notably decreases at the time of replacement of the fan motor or PIU, and therefore the time allowed for the replacement is limited to a shorter period of time.

SUMMARY

According to one aspect of the invention, there is provided a cooling structure for a housing device having a plurality of slots in which plug-in units are mountable. The cooling structure including: a housing in which the plurality of slots are arranged in parallel; an exhaust induction section adapted to induce a flow of cooling air, having passed through each of the plurality of slots in a first direction and being released from openings located at one end of the respective slots, to a second direction different from the first direction to discharge the cooling air from an air outlet of the housing device; and a division section adapted to divide the space inside the exhaust induction section into a plurality of regions corresponding to the openings of the slots, respectively, wherein the cooling air released from the openings of the slots passes through the corresponding regions among the plurality of regions obtained by the division section and is discharged from the air outlet.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram illustrating a front view and a right side view of the housing device in FIG. 7;

FIG. 22 is a diagram illustrating an example of another shape of a division plate related to the first embodiment;

FIG. 27 is a diagram illustrating a variation (2) of the shape of the division plate related to the second embodiment;

FIG. 28 is a diagram illustrating a variation (3) of the shape of the division plate related to the second embodiment;

FIG. 29 is a diagram illustrating a variation (4) of the shape of the division plate related to the second embodiment;

FIG. 30 is a diagram illustrating a variation (5) of the shape of the division plate related to the second embodiment;

FIG. 32 is a diagram illustrating an example of a concrete shape of the division plate in a third embodiment;

FIG. 33 is a diagram illustrating an example of a division plate having another shape related to the third embodiment;

FIG. 34 is a diagram illustrating an example of a preferable fixing structure for the top plate of the baffle section and the division plate;

FIG. 35 is a diagram illustrating a fixed state in the fixing structure in FIG. 34; and FIG. 36 is a diagram illustrating an example that division plates having different shapes are attached by using the fixing structure in FIG. 34.

DESCRIPTION OF EMBODIMENTS

The preferred embodiments of the invention will now be described in detail hereinafter with reference to the accompanying drawings.

Figure 7:
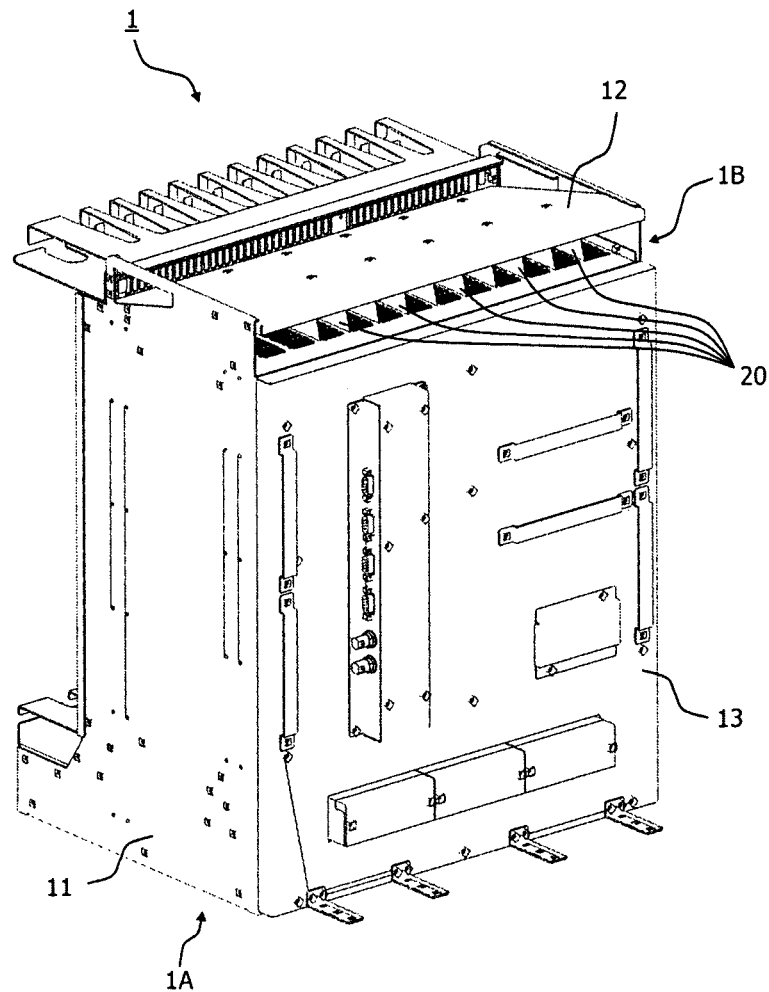
FIG. 7 is a perspective view illustrating the appearance of the housing device to which a cooling structure according to a first embodiment is applied.

FIG. 7 is a perspective view illustrating the appearance of a housing device to which a cooling structure according to a first embodiment is applied. FIG. 8 is a diagram illustrating a front view and a right side view of the housing device in FIG. 7. Further, FIG. 9 is a diagram illustrating a rear view and a transparent left side view of the housing device in FIG. 7.

Figure 1:
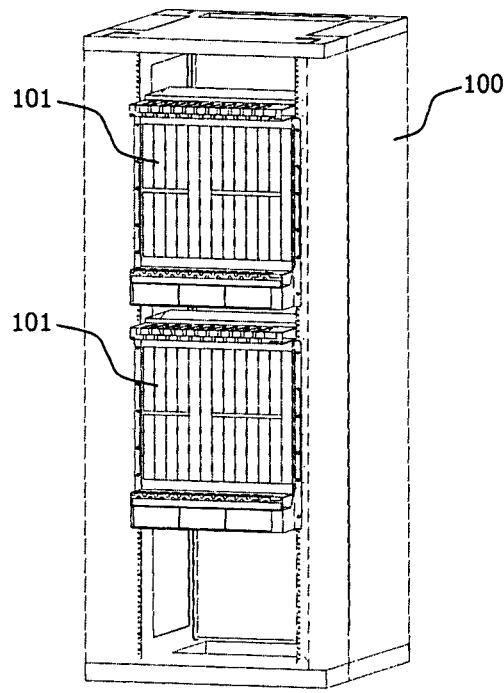
FIG. 1 is a perspective view illustrating the appearance of a rack in which a plurality of housing devices are stacked in multiple stages.
Figure 9:
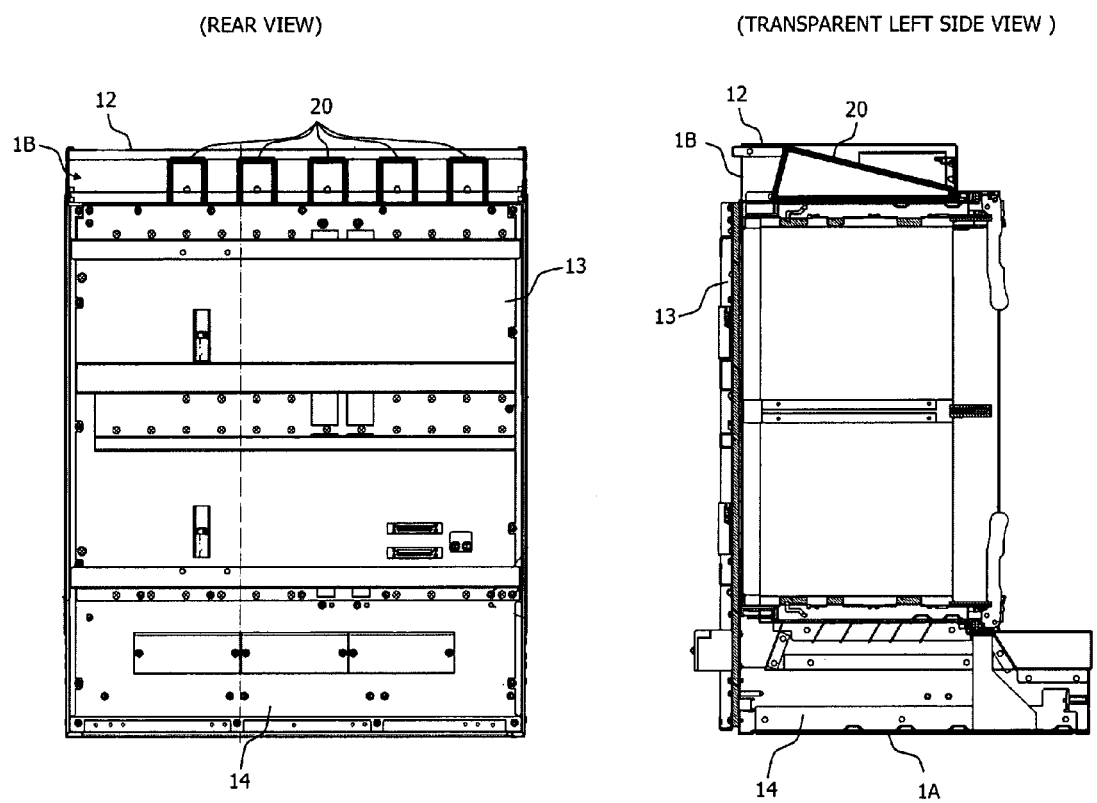
FIG. 9 is a diagram illustrating a rear view and transparent left side view of the housing device in FIG. 7.

A housing device 1 illustrated in FIG. 7 to FIG. 9 includes a housing 11 made of metal or the like, a baffle section 12 as an exhaust induction section mounted so as to cover the upper part of the housing 11, a plurality of division plates 20 as a division section arranged inside the baffle section 12, a back wiring board (BWB) 13 put in a backboard portion of the housing 11, and a fan unit 14 as a fan motor section put in the lower part of the housing 11. This housing device 1 is able to be used to house a plurality of housing devices 1 in the rack 100 in the same manner as illustrated in the above FIG. 1 as one transmission unit. The housing 11, the baffle section 12, the BWB 13, and the fan unit 14 in the above housing device 1 are basically similarly configured to the corresponding portions of the conventional housing device 101 illustrated in the above FIG. 2, but the configuration of the housing device 1 differs from the conventional housing device 101 in that the plurality of division plates 20 are added to the inside of the baffle section 12.

Figure 10:
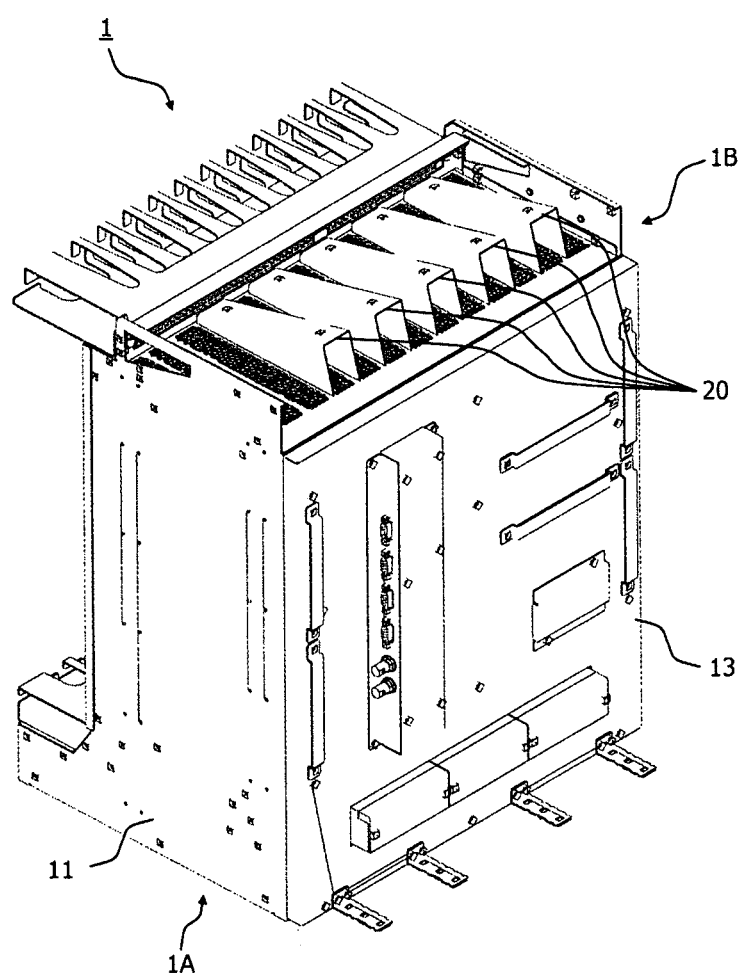
FIG. 10 is a perspective view of the housing device in FIG. 7 from which the top plate of the baffle section is removed.

FIG. 10 is a perspective view of the housing device 1 from which the top plate of the baffle section 12 is removed to enable checking of the configuration of the plurality of division plates 20 added to the inside of the baffle section 12. In this manner, the plurality of division plates 20 are associated with the openings of the respective slots located in the top surface of the housing 11 and divide the space inside the baffle section 12 into a plurality of regions. Here, the respective division plates 20 are fixed in predetermined positions in the baffle section 12 by using threaded holes formed in the top plate of the baffle section 12 so that the division plates 20 correspond to the openings of the slots.

Although there is illustrated an example of fixing the division plates 20 to the top plate of the baffle section 12 here, the division plates 20 may be fixed in predetermined positions in the baffle section 12 by using the housing 11. In addition, although there is illustrated an example of the baffle section 12 and the housing 11 separated from each other in structure, the baffle section 12 and the housing 11 may be formed as an integral structure. If the baffle section 12 and the housing 11 are separated from each other in structure, the division plates 20 is able to be easily attached or replaced. On the other hand, the baffle section 12 separated from the housing 11 in structure enables a reduction in the number of parts of the housing device 1 and a decrease in the cost.

Figure 11:
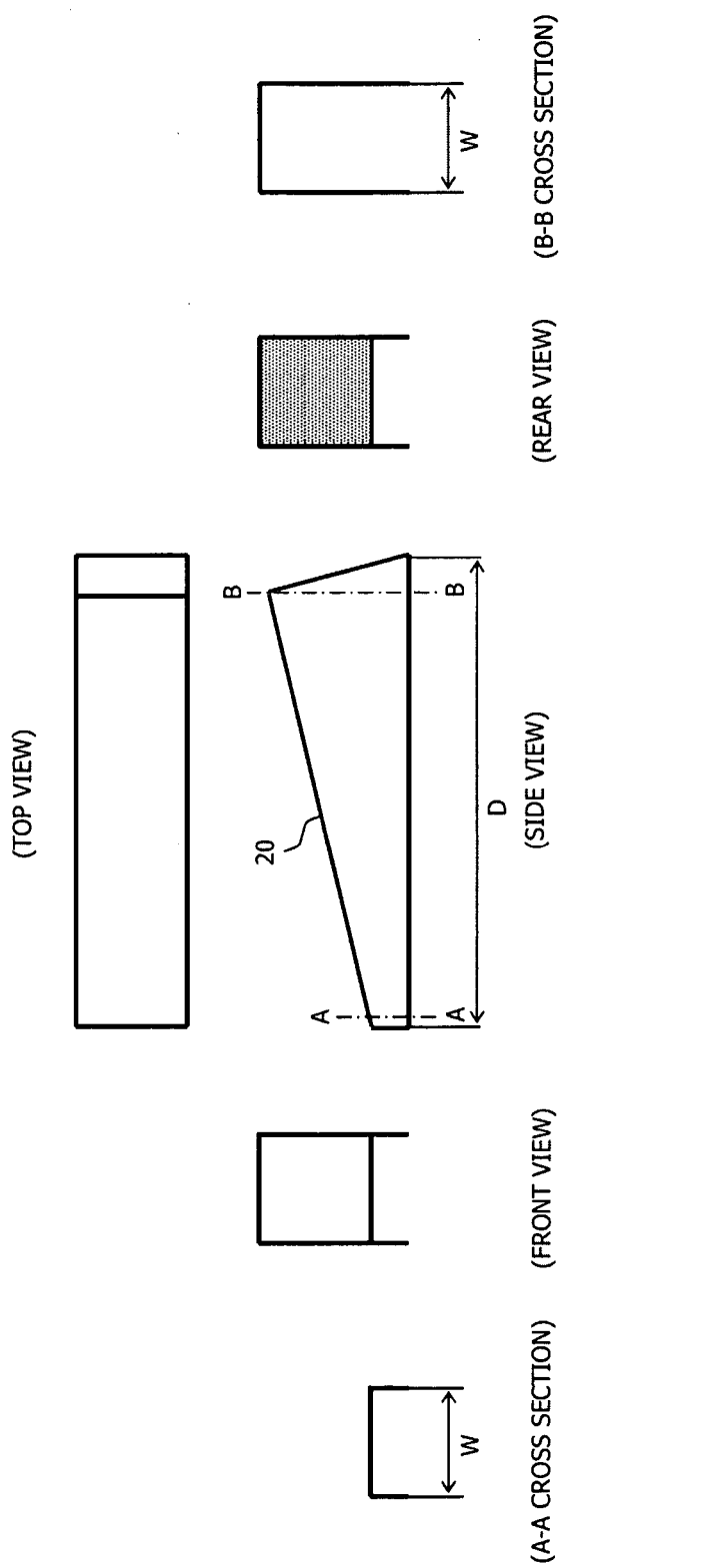
FIG. 11 is a diagram illustrating an example of a concrete shape of a division plate in the first embodiment.

FIG. 11 is a diagram illustrating an example of a concrete shape of the division plate 20 described above.

In FIG. 11, the division plate 20 has a U-shaped (rectangular-shaped with the base open) cross section in the front view and in the rear view. A distance between the two opposing sides of the U-shape is equal to the width W of one slot and the length of the two opposing sides varies with the distance from the opening of the slot to the top plate of the baffle section 12 (A-A cross section, B-B cross section). In addition, the length of one side corresponding to the base in the side view is equal to the depth D of the slot. The division plates 20 each having this shape are arranged alternately over the openings of the plurality of slots (See FIGS. 8 to 10), by which the space inside the baffle section 12 is divided into a plurality of regions corresponding to the slots. In the example illustrated in FIG. 8 to FIG. 10, when the division plates 20 are arranged alternately over the openings of the plurality of slots, no division plate 20 is arranged only over the opening of the slot located at the right edge in the front view. This is because a sufficient amount of air passing through the rightmost slot is secured structurally, and therefore even if the slot is affected by adjacent slots, there is no problem of a decrease in cooling performance. The omission of the unnecessary division plate 20 is intended for a reduction in cost of the housing device 1.

Figure 12:
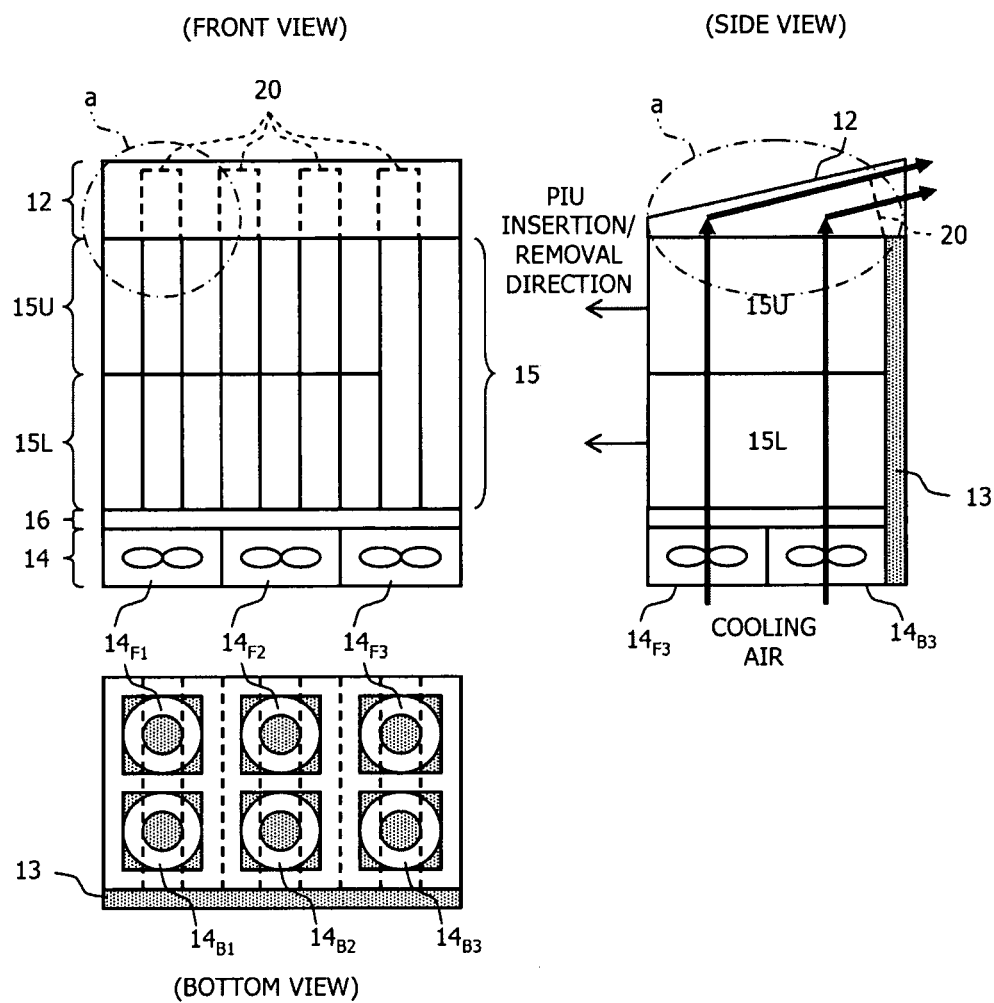
FIG. 12 is a diagram for describing the flows of cooling air in the first embodiment.
Figure 13:
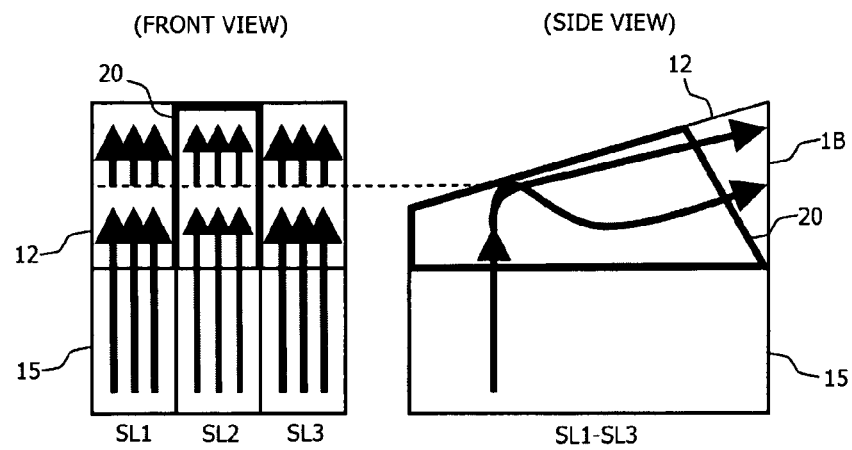
FIG. 13 is a diagram for describing the flows of the cooling air released from the adjacent slots in the first embodiment.

FIG. 12 and FIG. 13 are diagrams for describing the flows of the cooling air in the housing device 1 in the above. For easy comparison with the flows of the cooling air in the conventional configuration illustrated in the above FIG. 4 to FIG. 7, the same conditions are applied to the arrangement of the slots and fan motors.

As illustrated in FIG. 12, also in the housing device 1, the fan motors $14_{F1}$ to $14_{F3}$ and $14_{B1}$ to $14_{B3}$ provided in the fan unit 14 are driven, by which the cooling air taken from an air inlet 1A located in the bottom face passes through the fan unit 14 and an air plenum section 16 and is induced into the respective slots in the slot region 15 corresponding to the full-size PIUs and into the respective slots in the lower-stage slot region 15L out of the slot regions 15U and 15L corresponding to the half-size PIUs. The air plenum section 16 is provided, for a case where a part of the fan motors are disabled due to a failure, replacement, or the like, to cause the cooling air from remaining fan motors to be supplied to the slots located above the fan motors disabled.

The cooling air, having flown from the lower side to the upper side in the respective slots in the slot region 15, is released into the baffle section 12. Moreover, the cooling air, having flown from the lower side to the upper side in the respective slots in the lower-stage slot region 15L, flows from the lower side to the upper side in the upper-stage slot region 15U in the same slot and is released into the baffle section 12.

Then, in the baffle section 12, as illustrated in the enlarged view of FIG. 13, the cooling air (exhaust air), having passed through the slots SL1 to SL3, is induced in the rear direction by the top plate of the baffle section 12 while passing through the regions obtained by the division plates 20 for individual slots and is discharged from an air outlet 1B located in the upper part of the rear to the outside. In this process, even if the amount of air passing through the slot SL2 is less than the amount of air passing through each of the adjacent slots SL1 and SL3 due to a structural factor of the housing device described above, there is no mutual interference between the cooling air flows corresponding to the respective slots. Therefore, no turbulence occurs in the cooling air flows as illustrated in the above FIG. 6, and the cooling air from the slots SL1 to SL3 smoothly flows in the baffle section 12.

As described in the above, in the housing device 1, the space inside the baffle section 12 is basically divided into regions for individual slots by the division plates 20, by which the cooling air released from the openings of the slots passes through the airflow paths substantially independent of each other for each slot also in the baffle section 12. One slot is defined according to the arrangement (See the front view in FIG. 8) of the connectors 13A on the BWB 13, and the slot corresponding to the connector 13A, in which the full-size PIU is mountable, forms a substantially independent airflow path by the mounting of one PIU or a filler panel as an alternative thereto. Moreover, a slot corresponding to the connectors 13A in upper and lower two stages, in which half-size PIUs are mountable, forms a substantially independent airflow path by the mounting of two PIUIs or a filler panel as an alternative to one or both of the PIUs.

So, after being taken from the air inlet 1A located in the bottom face of the housing device 1 and supplied to the respective slots in a pushing manner by the fan unit 14, the cooling air passes through the respective slots from the lower side to the upper side and then follows the airflow paths substantially independent of each other for each slot until the airflow in the baffle section 12 is induced in the rear direction and reaches the vicinity of the air outlet 1B located in the upper part of the rear. Therefore, even if any difference occurs in the amount of passing air among the slots due to a structural factor of the housing device 1, the difference does not further increase in the baffle section 12, thus reliably reducing the deterioration of the cooling capacity of a slot through which relatively less amount of air passes.

In addition, there may be a gap near a joint portion between the connector 13A on the BWB 13 and the PIU, near the boundary between the opening of each slot and each division plate 20, or the like. In this case, it is difficult to form the airflow paths completely independent of each other for each slot, but there is particularly no problem in the gap as long as the gap does not substantially produce any change in the amount of air passing through each slot.

Here, description is made on the flow of the cooling air in the housing device 1 in the case where at least one fan motor of the fan unit 14 breaks down or is removed, or in the case where a part of PIUs (or filler panels) are removed. First, the following discusses a case where two fan motors $14_{F1}$ and $14_{B1}$ located on the left side in the front view and in the bottom view are removed in the configuration example illustrated in the above FIG. 12. The flows of the cooling air in the case of a failure of the fan motors can be thought in the same manner as the case of the removal of the fan motors.

Figure 2:
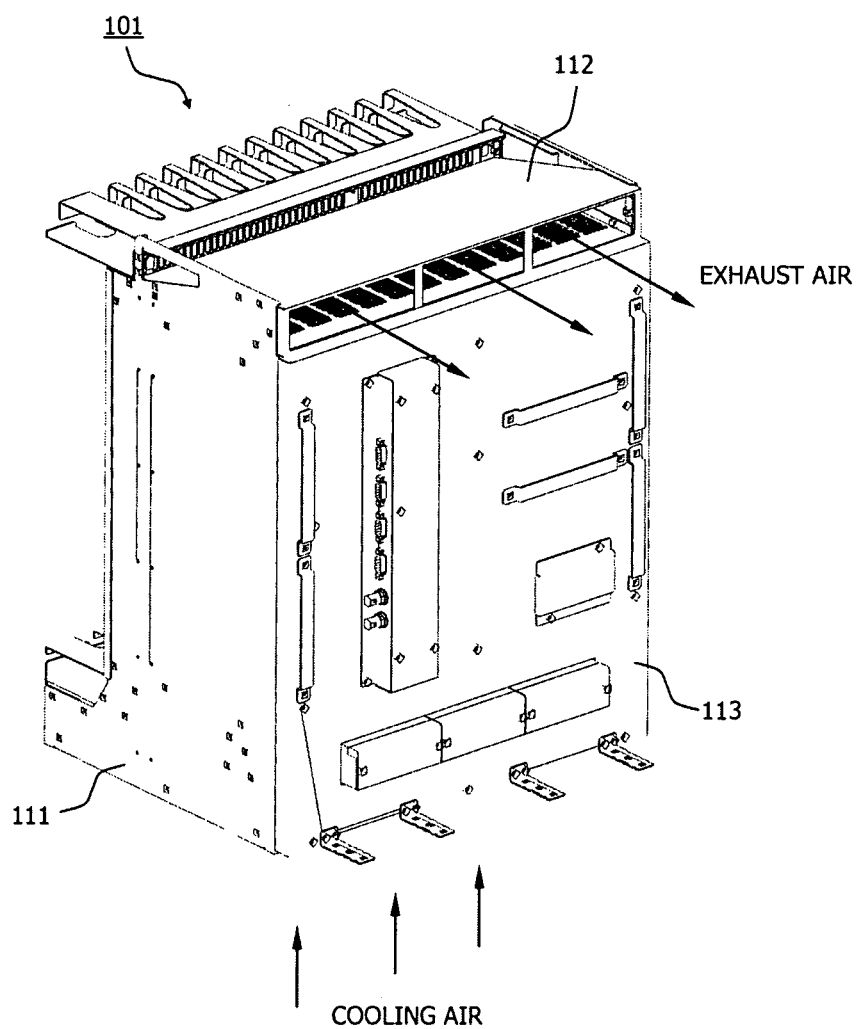
FIG. 2 is a perspective view illustrating a configuration example of a conventional housing device.
Figure 3:
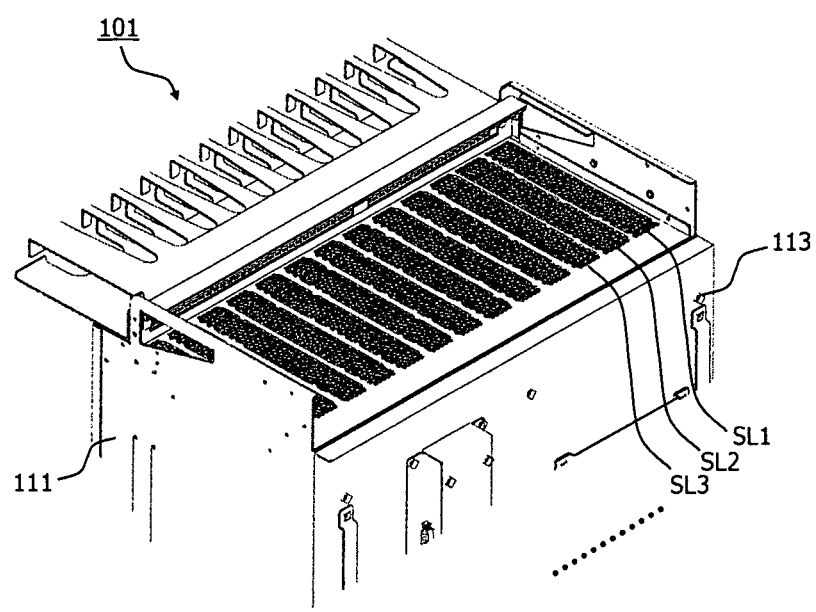
FIG. 3 is a perspective view of the conventional housing device from which the top plate of a baffle section is removed.
Figure 4:
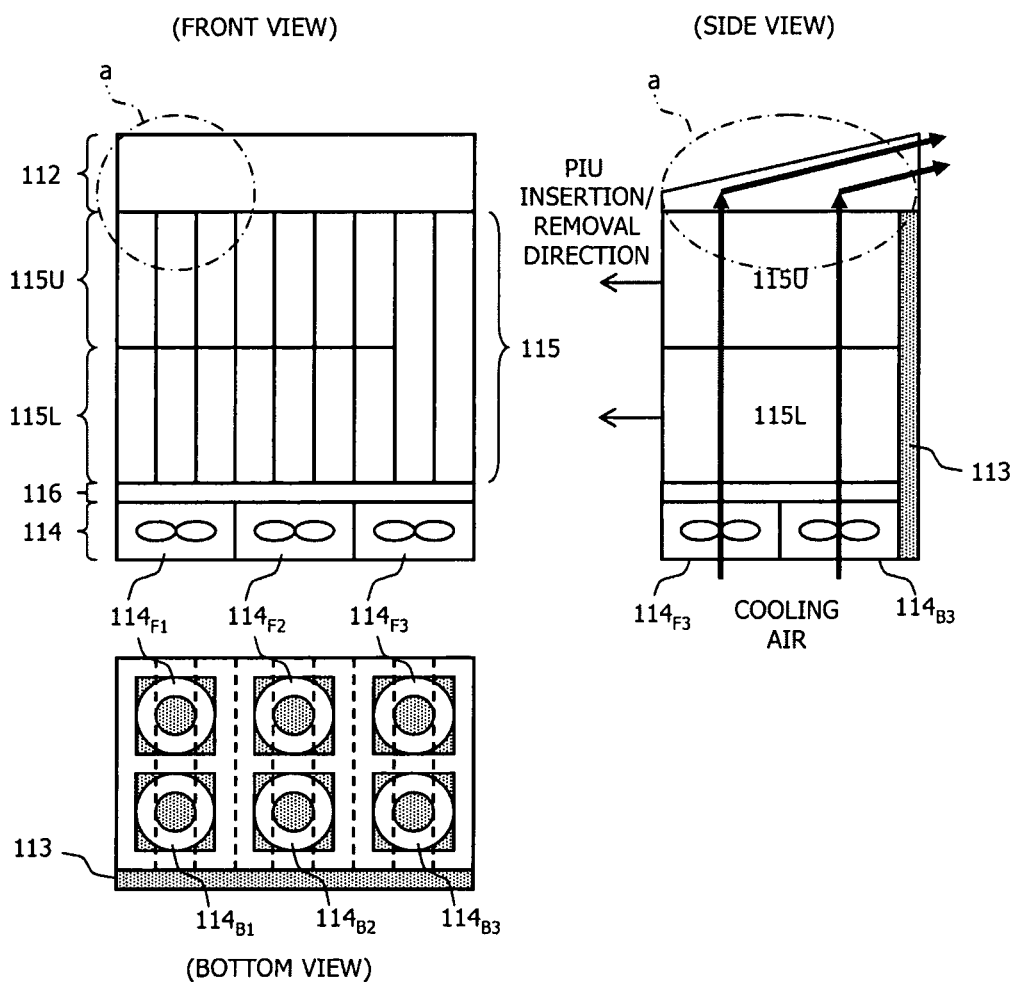
FIG. 4 is a diagram for describing the flows of cooling air in the conventional housing device.
Figure 5:
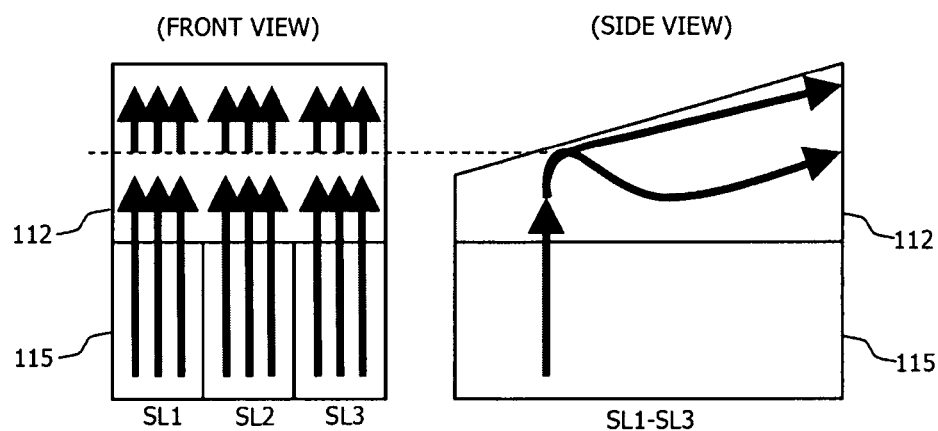
FIG. 5 is a diagram for describing the flows of the cooling air when the same amount of air passes through each of the adjacent slots in the conventional housing device.
Figure 6:
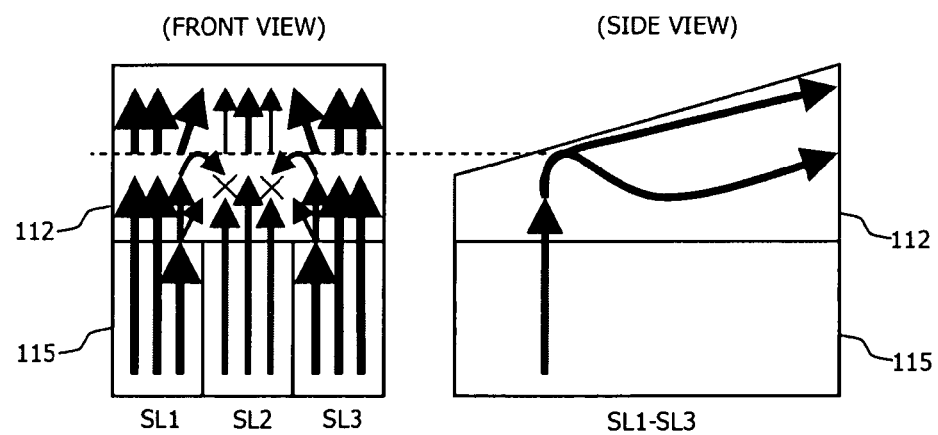
FIG. 6 is a diagram for describing the flows of the cooling air when there is a difference in the amount of passing air among slots adjacent to each other in the conventional housing device.
Figure 14:
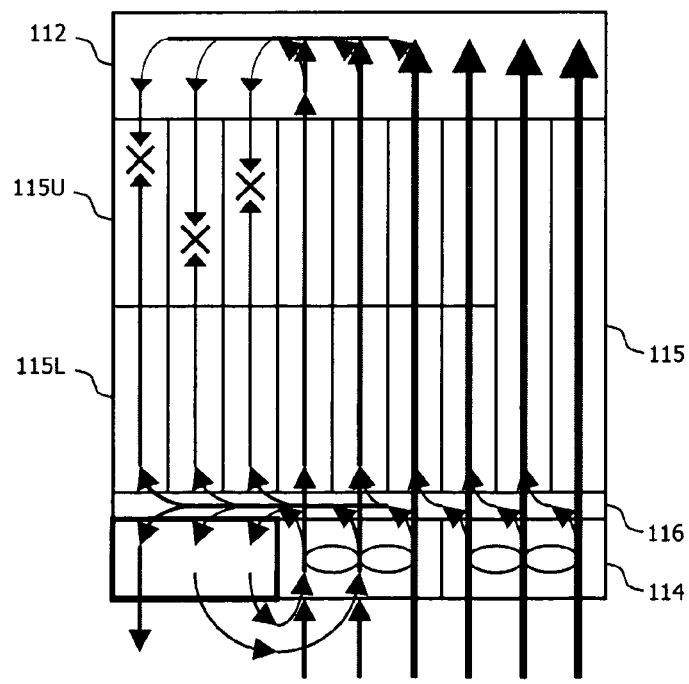
FIG. 14 is a diagram illustrating the conventional flows of the cooling air in a state where fan motors are removed.

In this case, in the conventional housing device 101 having no division plates for the slots in the baffle section as illustrated in the above FIGS. 2 to 4, the cooling air sucked by the fan motors located in the center and deviated to the left in the air plenum section 116 flows into the slots, which are located above the fan motors removed from the fan unit 114 (three slots located on the left side in FIG. 14), though it is a small amount of air, and the cooling air is going to flow from the lower side to the upper side, as illustrated in FIG. 14. In the baffle section 112, however, a large difference in pressure between the slots also causes airflow in the reverse direction, and therefore the amount of air passing through the slots further decreases or approaches zero and a backflow may occur in some cases.

Therefore, in a state where a part of the fan motors of the fan unit 114 are removed in the conventional housing device 101, the amount of air passing through the slots located above the removed fan motors dramatically goes down, thereby causing a rapid increase in temperature of the PIUs mounted in the slots. Therefore, the time allowed for the replacement of the fan unit is limited to a very short period of time.

Figure 15:
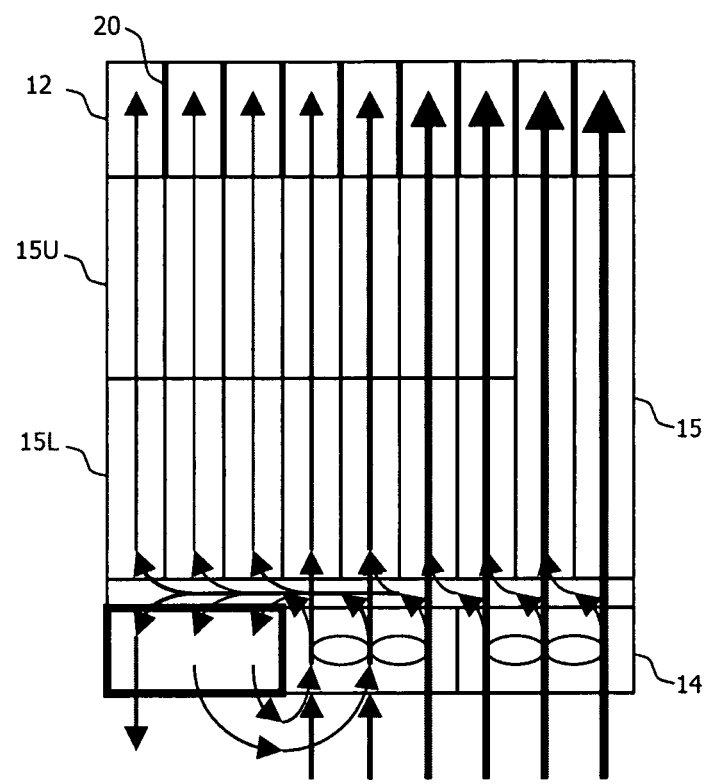
FIG. 15 is a diagram illustrating the flows of the cooling air in the first embodiment in a state where fan motors are removed.

On the other hand, in the housing device 1 with the division plates for the slots put in the baffle section, the cooling air sucked by the fan motors located in the center and deviated to the left in the air plenum section 16 flows into the slots, which are located above the fan motors removed from the fan unit 14 (three slots located on the left side in the front view of FIG. 15), though it is a small amount of air, and the cooling air is going to flow from the lower side to the upper side, in the same manner as the conventional housing device, as illustrated in FIG. 15. In this situation, since the space inside the baffle section 12 is divided by the division plates 20 into the regions corresponding to the slots, the cooling airflows released from the adjacent slots to the baffle section 12 smoothly flow into the baffle section 12 without mutual interference.

Accordingly, in the state where a part of the fan motors of the fan unit 14 are removed in the housing device 1, the amount of air passing through each of the slots located above the removed fan motors is secured to some extent and the temperature rise of the PIUs mounted in the slots is moderate in comparison with the conventional housing device. Therefore, the time allowed for the replacement of the fan unit is able to be extended according to the moderation of the temperature rise.

The following discusses a case where the lower-stage PIU (or filler panel) in the third slot from the left in the front view is removed for replacement or the like in the configuration example illustrated in the above FIG. 12.

Figure 16:
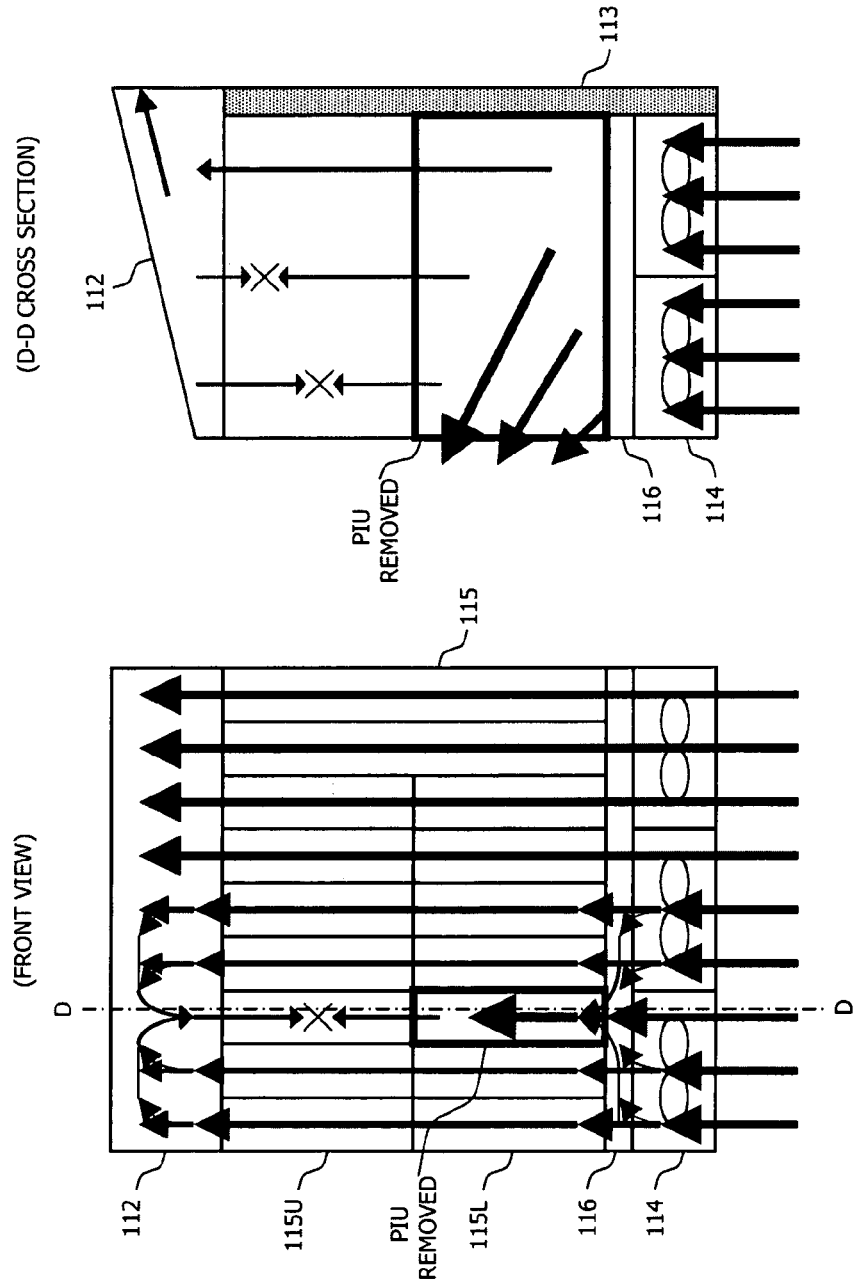
FIG. 16 is a diagram illustrating the conventional flows of the cooling air in a state where lower-stage PIUs are removed.

In this case, in the conventional housing device 101, the cooling air, which has passed through the fan unit 114 and the air plenum section 116 and is supplied to the slot from which the PIU is removed, largely leaks to the outside from the opening generated in front of the slot and only a small amount of remaining air is going to flow upward, as illustrated in FIG. 16. In the baffle section 112, however, a large difference in pressure between slots also causes airflow in the reverse direction, and therefore the amount of air passing through the slot further decreases or approaches zero and a backflow may occur in some cases.

Therefore, in a state where the PIUs for a part of the slots are removed in the conventional housing device 101, the amount of air passing through the slots dramatically goes down, which causes a rapid temperature rise of the PIUs mounted in the slots. Therefore, the time allowed for the replacement of the PIUs is limited to a very short period of time.

Figure 17:
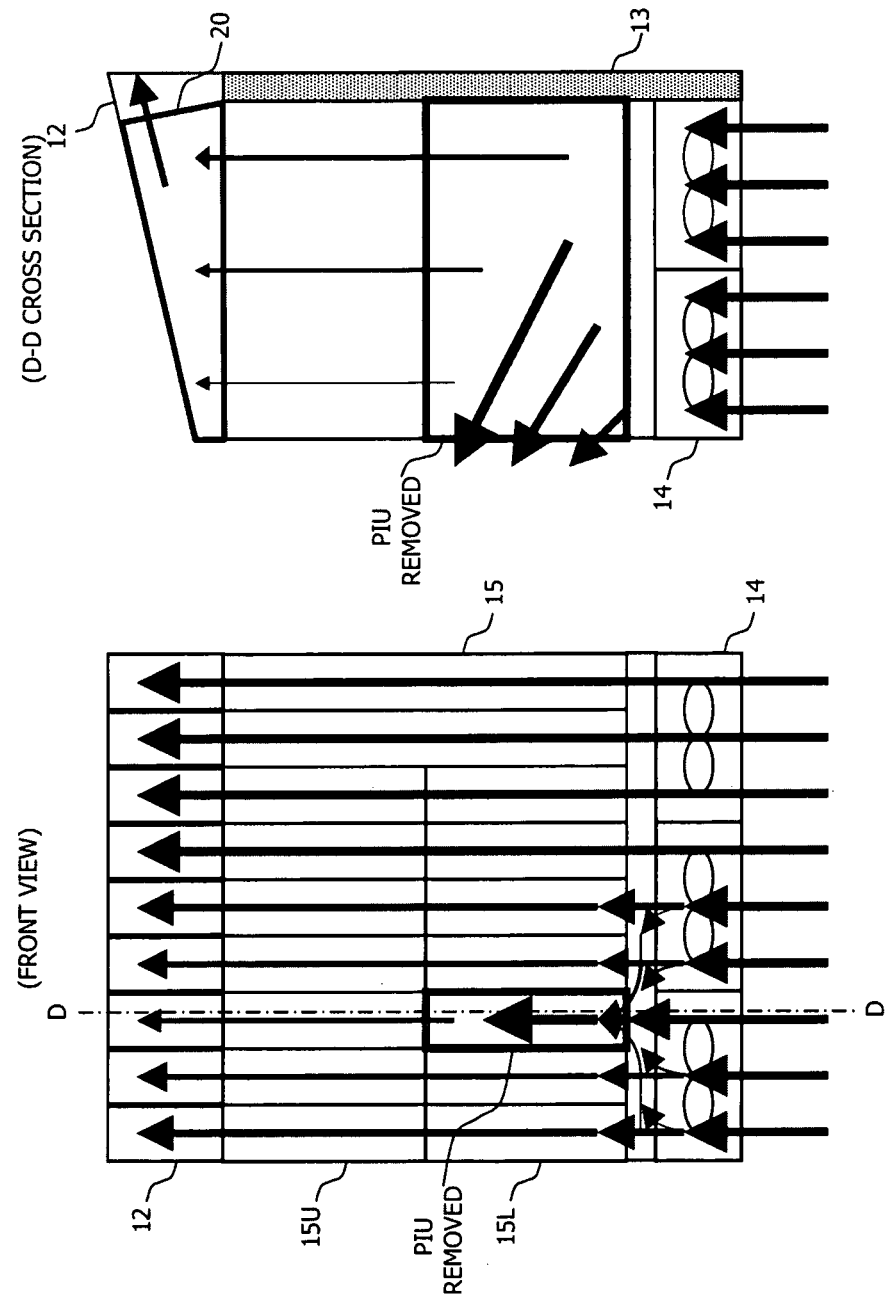
FIG. 17 is a diagram illustrating the flows of the cooling air in the first embodiment in a state where lower-stage PIUs are removed.

On the other hand, in the housing device 1 with the division plates for the slots put in the baffle section, the cooling air, which has passed through the fan unit 14 and the air plenum section 16 and is supplied to the slot from which the PIU is removed, largely leaks to the outside from the opening generated in front of the slot and only a small amount of remaining air is going to flow upward similarly to the above conventional housing device, as illustrated in FIG. 17. In this condition, the space inside the baffle section 12 is divided by the division plates 20 into the regions corresponding to the slots, by which the cooling airflows released from the adjacent slots to the baffle section 12 smoothly flow into the baffle section 12 without mutual interference.

Accordingly, in the state where the PIUs for a part of the slots are removed in the housing device 1, the amount of air passing through each of the slots is secured to some extent and the temperature rise of the PIUs mounted in the slots is moderate in comparison with the conventional housing device. Therefore, the time allowed for the replacement of the PIUs is able to be extended according to the moderation of the temperature rise.

Figure 18:
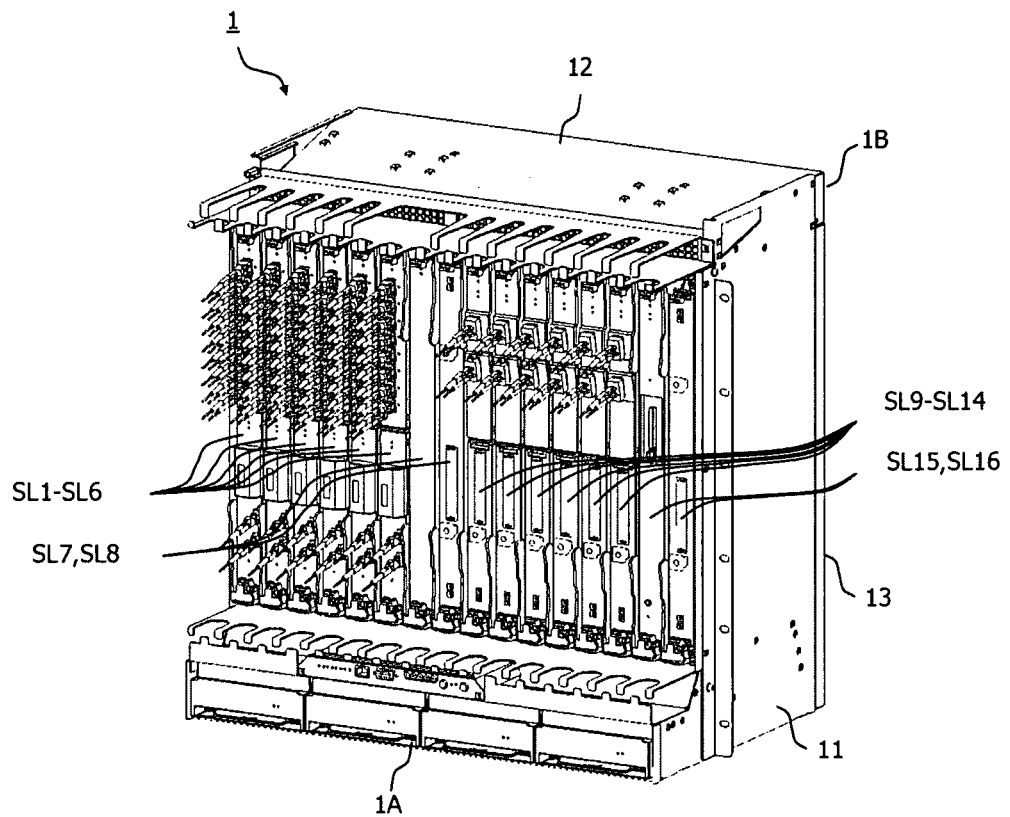
FIG. 18 is a perspective view illustrating a slot configuration which is assumed by a simulation of the amount of air passing through the slots.

The following describes the result of a simulation for determining how much the amount of air passing through each slot changes depending on the presence or absence of the division plates in the baffle section. This simulation assumes a slot configuration as illustrated in the perspective view of FIG. 18 as a model of the housing device. Specifically, slot numbers are respectively given to 16 slots in order from the left when viewed from the front. In the slot configuration, half-size PIUs are mountable in slots SL1 to SL6 and SL9 to SL14 and full-size PIUs are mountable in slots SL7, LS8, SL15, and SL16.

Figure 19:
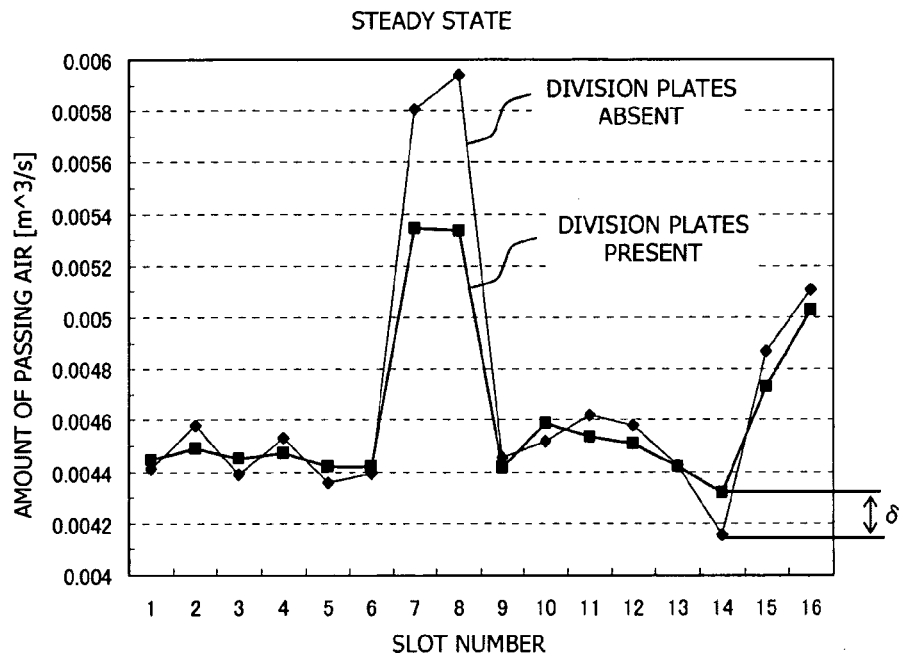
FIG. 19 is a diagram illustrating a simulation result in a steady state.

FIG. 19 illustrates a simulation result of a relation between the presence or absence of the division plates in the baffle section and the amount of air passing through each slot in a state where the PIUs are mounted in all of the slots (a steady state). It is apparent from FIG. 19 that, in the case of the absence of the division plates as indicated by diamond-shaped signs, a relatively large variability occurs in the amount of air passing through each of the slots corresponding to the PIUs having the same size. Here, a large difference in the amount of passing air between the slots for the half size and the slots for the full size is caused by a difference that occurs in whether air flows well according to a difference in the internal structure of the slots (for example, the number of rails for guiding the PIU).

On the other hand, in the case of the presence of the division plates as indicated by square signs, it is understood that the variability is effectively reduced in the amount of air passing through each of the slots corresponding to the PIUs having the same size. Moreover, it is understood that the amount of air passing through the slot SL14 through which the least amount of air passes among all of the slots increases by δ due to the use of the division plates. This enables improvement of the cooling performance of the entire housing device. Although the use of the division plates greatly decreases the amount of air passing through the slots SL7 and SL8 for the full size, there is no problem in the cooling capacity since a sufficient amount of passing air is secured in comparison with the case of the slots for the half size.

Figure 20:
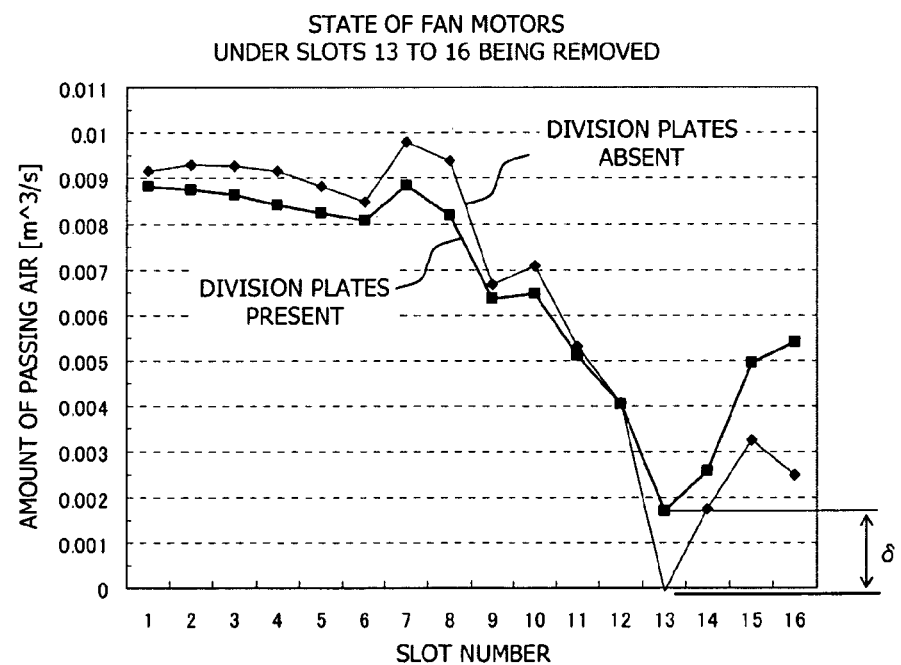
FIG. 20 is a diagram illustrating a simulation result in a state where fan motors are removed.

FIG. 20 illustrates a simulation result of a relation between the presence or absence of the division plates in the baffle section and the amount of air passing through each slot in a state where the fan motors located under the slots SL13 to SL16 are removed. It is apparent from FIG. 20 that the removal of the fan motors greatly decreases the amount of air passing through each of the slots SL13 to SL16 in comparison with the above steady state and that almost no cooling air is supplied to the slot SL13 through which the least amount of air passes in the configuration without the division plates. On the other hand, the use of the division plates increases the amount of passing air for all of the slots SL13 to SL16, and cooling air corresponding to the increment δ is also supplied to the slot SL13 through which the least amount of air passes. This moderates the temperature rise of the PIUs in the state where the fan motors are removed and enables the extension of the time period allowed for the replacement of the fan motors.

Figure 21:
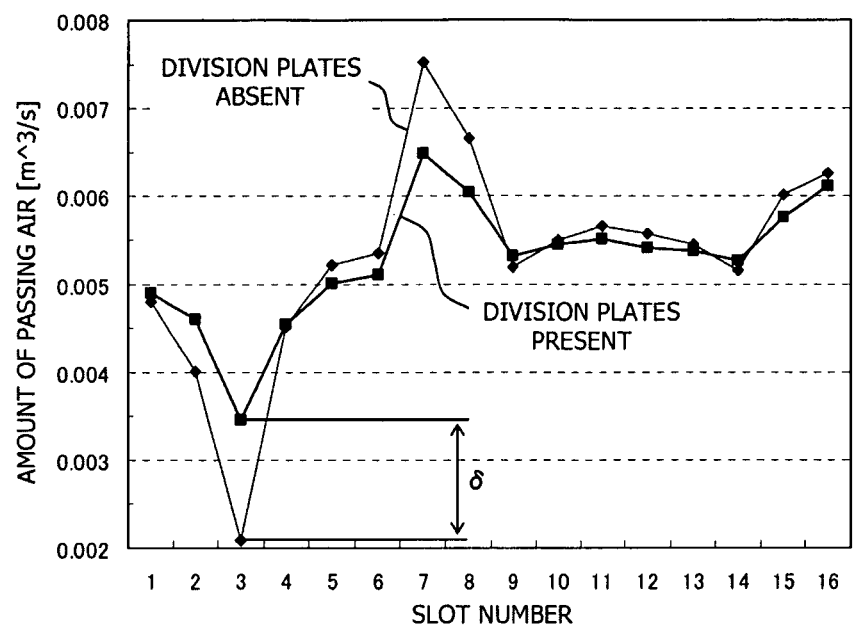
FIG. 21 is a diagram illustrating a simulation result in a state where lower-stage PIUs are removed.

FIG. 21 illustrates a simulation result of a relation between the presence or absence of the division plates in the baffle section and the amount of air passing through each slot in a state where the lower-stage PIU in the slot SL3 is removed. It is apparent from FIG. 21 that the removal of the lower-stage PIU greatly decreases the amount of air passing through the slot SL3 in comparison with the above steady state and that only a negligible amount of cooling air is supplied to the upper-stage PIU in the slot SL3 in the configuration without the division plates. On the other hand, the use of the division plates increases the amount of air passing through the slot SL3 by δ, and a certain amount of cooling air is supplied to the upper-stage PIU in the slot SL3. This moderates the temperature rise of the upper-stage PIU in the state where the lower-stage PIU is removed and enables the extension of the time period allowed for the replacement of the lower-stage PIU.

Figure 23:
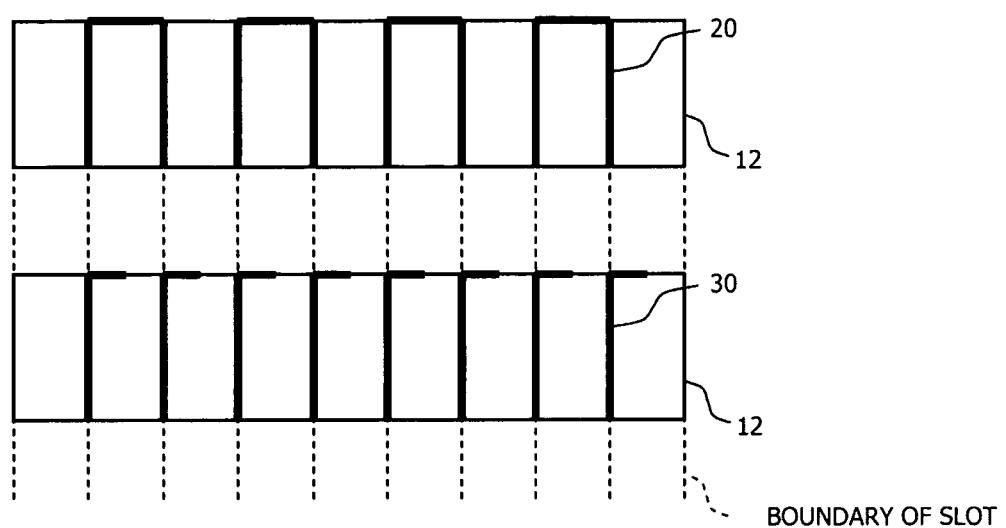
FIG. 23 is a diagram illustrating an arrangement example of the division plates, each of which is illustrated in FIG. 22, within the baffle section.

Although the description has been made on the configuration example with the division plates 20 having the U-shaped cross section in the front view and in the rear view as illustrated in FIG. 11 and the like in the first embodiment, the shape of the division plate 20 is not limited to the above example. For example, as illustrated in FIG. 22, it is possible to use a division plate 30 having an L-shaped cross section in the front view and in the rear view. In this division plate 30, the length of a vertically extending side of the L-shaped cross section varies with the distance from the opening of the slot to the top plate of the baffle section 12. The length of the side corresponding to the base in the side view is equal to the depth D of the slot. Although FIG. 22 illustrates a shape in which the right side (a side located on the rear side in the side view) is orthogonal to the base, the right side may be inclined toward the front side in the shape in the same manner as for the division plate 20 illustrated in the above FIG. 11. The division plates 30 each having the above shape are arranged so as to correspond to the boundaries of the slots as illustrated in the lower part of FIG. 23.

Moreover, although the first embodiment has illustrated the example that the cooling air released from each slot is discharged by the baffle section 12 from the air outlet 1B located in the upper part of the rear of the housing device 1, the top plate of the baffle section 12 may be inclined in the reverse direction so that the cooling air is discharged toward the front side of the housing device 1. Furthermore, although the above has described the configuration example that the cooling air is taken from the air inlet 1A located in the bottom face of the housing device 1, a baffle section may be provided also on the lower side of the fan unit 14 to take cooling air from the lower part of the front or the lower part of the rear of the housing device 1.

Subsequently, a second embodiment of the cooling structure for the housing device will be described.

In the first embodiment described above, the division plates 20 for the slots are put in the baffle section 12 to reduce the mutual interference of the cooling air released from the respective slots, thereby preventing a further increase in the difference in the amount of passing air among slots caused by a structural factor of the housing device. As apparent from the thickness of the arrow lines in the front view illustrated in the above FIG. 13, a difference in the amount of passing air among slots caused by the structural factor of the housing device still remains after the use of the division plates. Therefore, in the second embodiment, there is described an application example that a new twist is added to the shape of the division plate to reduce (equalize) the difference in the amount of passing air among slots caused by the structural factor.

Figure 24:
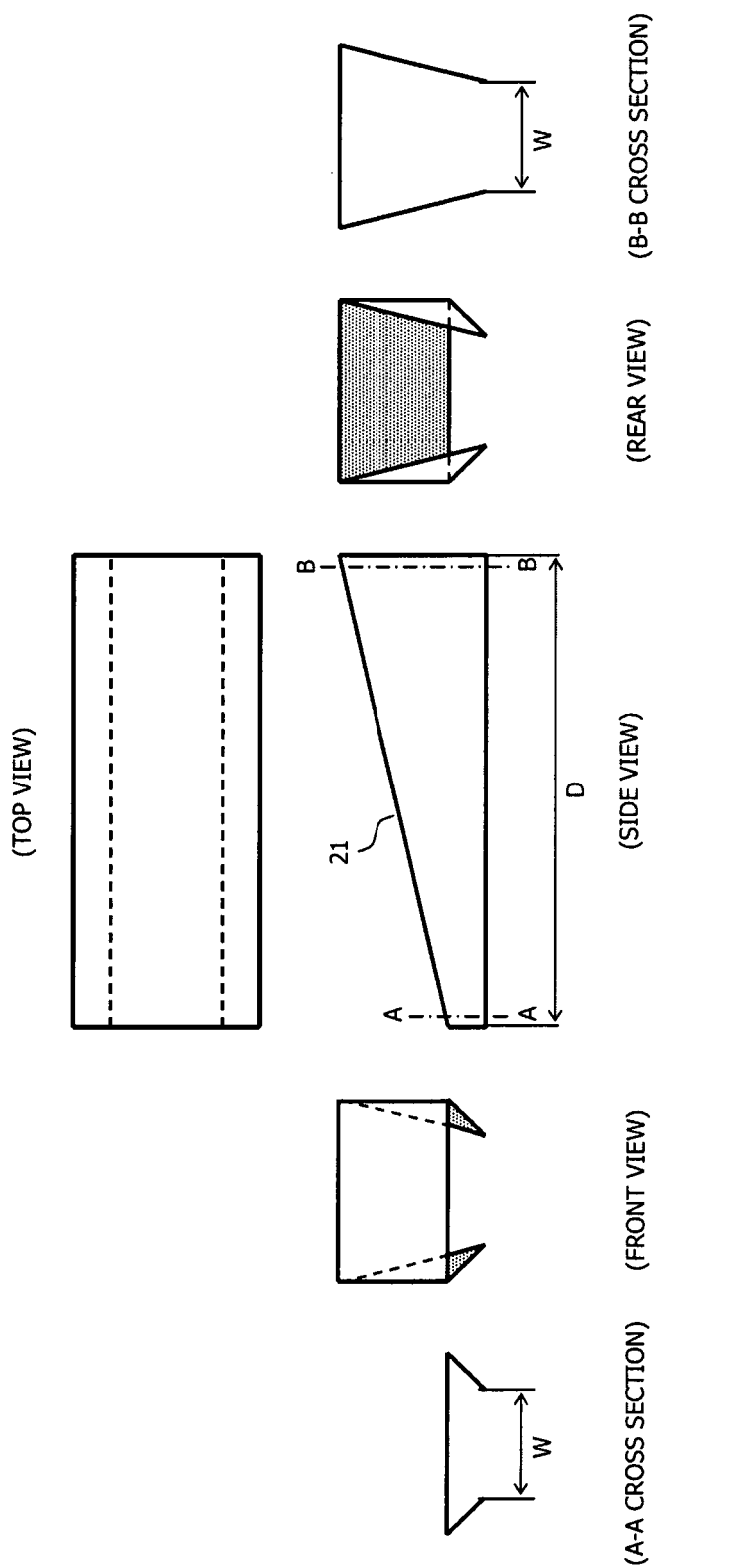
FIG. 24 is a diagram illustrating an example of a concrete shape of the division plate in a second embodiment.

FIG. 24 is a diagram illustrating an example of a concrete shape of the division plate in the second embodiment. Other components of the second embodiment other than the division plates are the same as in the first embodiment described above, and therefore the description of the components will be omitted here.

In FIG. 24, a division plate 21 has a substantially U-shaped (trapezoidal-shaped with the base open) cross section in the front view and in the rear view. A distance between the ends of the two opposing sides of the substantially U-shape is equal to the width W of one slot and the length of one side (the upper side) between the two opposing sides is longer than the width W of the slot (A-A cross section, B-B cross section). In addition, the length of one side corresponding to the base in the side view is equal to the depth D of the slot, and the upper side facing the base inclines along the inclination of the top plate of the baffle section 12. The division plate 21 having this shape is provided with an angle in each of two opposing lateral sides, by which the volume of the inside region enclosed by the division plate 21 increases in comparison with the case of the division plate 20 in the first embodiment. The division plates 21 are arranged inside the baffle section 12 so as to correspond to the slots through which relatively less amount of air passes due to the structural factor of the housing device.

Figure 25:
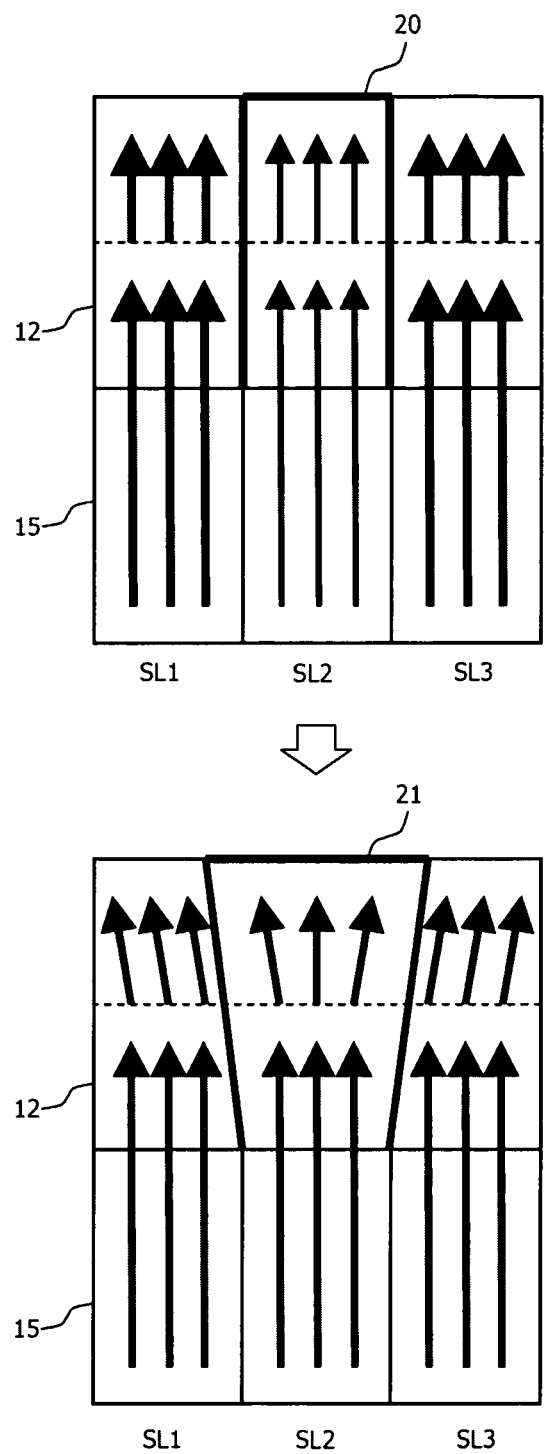
FIG. 25 is a diagram illustrating a comparison between the flows of the cooling air released from the adjacent slots in the first and second embodiments.

FIG. 25 is a diagram illustrating a comparison between the flows of the cooling air in the case of the use of the division plate 20 in the first embodiment and the flows of the cooling air in the case of the use of the division plate 21 in the second embodiment for the slot SL2 through which relatively less amount of air passes due to the structural factor of the housing device among three slots SL1 to SL3 adjacent to each other. In the case of the use of the division plate 20 according to the first embodiment, as illustrated in the upper part of FIG. 25, the space inside the baffle section 12 is equally divided into the three slots SL1 to SL3. Therefore, the slot dependence in the amount of passing air caused by the structural factor of the housing device is basically maintained. On the other hand, in the case of the use of the division plate 21 according to the second embodiment, the space inside the baffle section 12 is divided in such a way that the volume of the region corresponding to the slot SL2 inside the division plate 21 is larger than the volume of each of the regions corresponding to the slots SL1 and SL3 outside the division plate 21.

If the volume of the divided region corresponding to the slot SL2 increases in the baffle section 12, the pressure of the cooling air released into the divided region relatively decreases. As a result, air flows through the slot SL2 better than before and the amount of air passing through the slot SL2 increases. In contrast, pressure increases due to the decrease in the volume of the divided regions corresponding to the slots SL1 and SL3, and therefore air flows poorly through the slots SL1 and SL3 and the amount of air passing through each of the slots SL1 and SL3 decreases. Accordingly, the difference in the amount of passing air among the slots SL1 to Sl3 is able to be reduced (equalized) by appropriately designing the shape (the inside volume) of the division plate 21 according to the difference in the amount of passing air among the slots SL1 to SL3 caused by the structural factor of the housing device.

While the slot dependence in the amount of passing air caused by the structural factor of the housing device is equalized in the above description, the same technique as this is applicable to other cases such as, for example, a case of increasing the amount of air passing through a specific slot, which needs to have a high cooling capacity, or a case of decreasing the amount of air passing through a slot with excessive cooling capacity. In other words, the amount of passing air is able to be optimized for each slot by appropriately designing the shape (the inside volume) of the shape of the division plate 21 according to the thermal characteristic of the PIU mounted in the slot.

In view of the above, including the applications, the shape of the division plate 21 is not limited to the example illustrated in FIG. 24, but various variations may be made. Hereinafter, the variations of the division plate related to the second embodiment will be illustrated in FIGS. 26 to 31.

Figure 26:
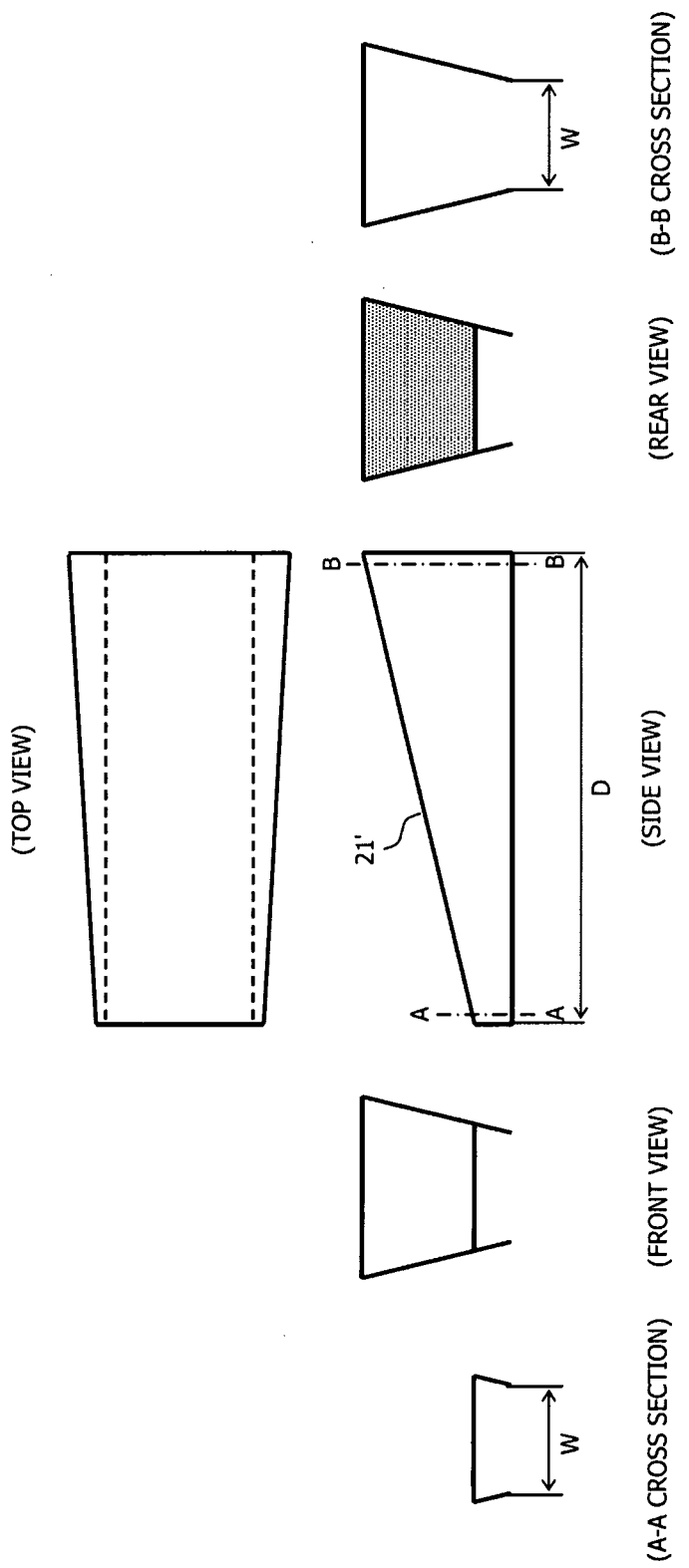
FIG. 26 is a diagram illustrating a variation (1) of the shape of the division plate related to the second embodiment.

A division plate 21' illustrated in FIG. 26 is a variation obtained by simplifying the shape of the division plate 21 illustrated in the above FIG. 24. The shape of the division plate 21' has the same inclination angles of the two opposing sides of the substantially U-shaped cross section between the front view and the rear view. As a result, the two opposing lateral sides of the division plate 21' are flat, instead of curved.

A division plate 22 illustrated in FIG. 27 is a variation obtained by turning the shape of the division plate 21 illustrated in the above FIG. 24 upside down. In the shape of the division plate 22, a distance between the ends of the two opposing sides of the substantially U-shaped cross section is equal to the width W of one slot and the length of one side (the upper side) between the two opposing sides is shorter than the width W of the slot. This decreases the inside volume of the division plate 22 in comparison with the division plate 20 of the first embodiment and thus enables a reduction in the amount of air passing through the slot under the division plate 22.

A division plate 22' illustrated in FIG. 28 is a variation obtained by simplifying the shape of the division plate 22 illustrated in the above FIG. 27. The shape of the division plate 22' has the same inclination angles of the two opposing sides of the substantially U-shaped cross section between the front view and the rear view. As a result, the two opposing lateral sides of the division plate 22' are flat, instead of curved.

A division plate 31 illustrated in FIG. 29 is a variation corresponding to the division plate 30 having the L-shaped cross section illustrated in the above FIG. 22. The division plate 31 has a lateral side inclined by decreasing the angle between the two sides of the L shape to an angle smaller than 90 deg. Contrary to the division plate 31, a division plate 32 illustrated in FIG. 30 has a lateral side inclined by increasing the angle between the two sides of the L shape to an angle greater than 90 deg.

Figure 31:
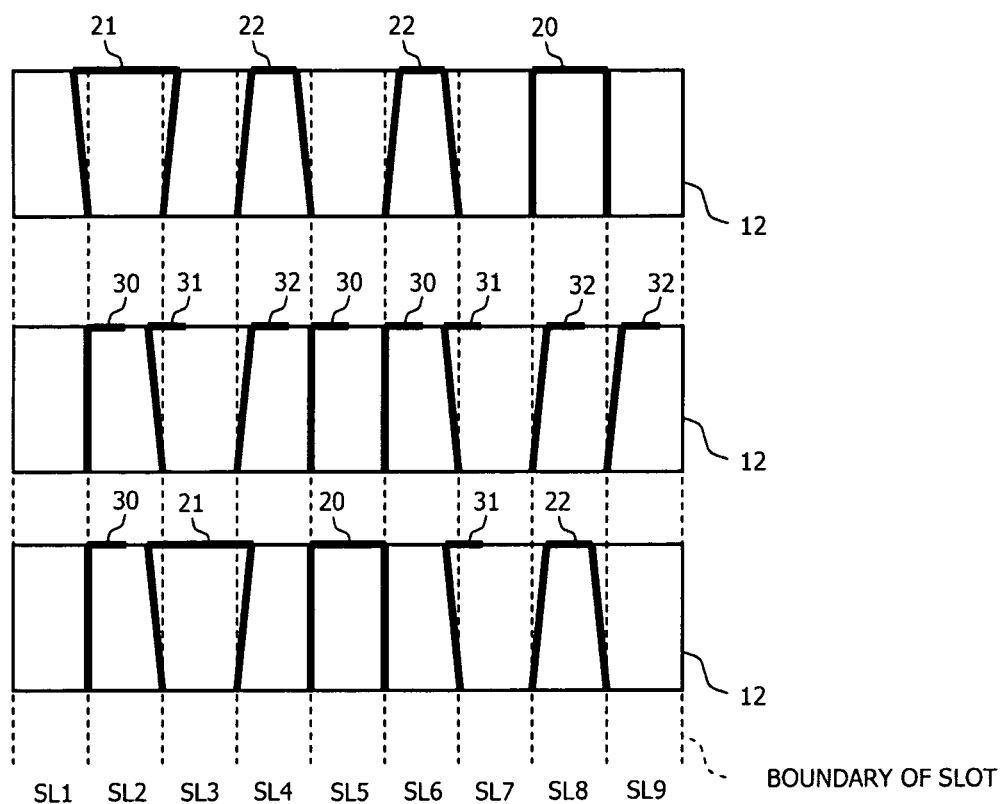
FIG. 31 is a diagram illustrating an arrangement example of a combination of division plates having various shapes within the baffle section.

FIG. 31 illustrates an arrangement example that the space within the baffle section 12 is divided by a combination of the division plates having various shapes described above. The arrangement at the top of FIG. 31 is an example of a combination of the division plates 20, 21, and 22. In comparison with the volumes of the divided regions corresponding to the slots SL3, SL8, and SL9, the volumes of the divided regions corresponding to the slots SL2, SL5, and SL7 increase, thereby increasing the amount of air passing through the slots SL2, SL5, and SL7, and the volumes of the divided regions corresponding to the slots SL1, SL4, and SL6 decrease, thereby decreasing the amount of air passing through the slots SL1, SL4, and SL6.

Moreover, the arrangement in the middle of FIG. 31 is an example of a combination of the division plates 30, 31, and 32. In comparison with the volumes of the divided regions corresponding to the slots SL1, SL5, and SL8, the volumes of the divided regions corresponding to the slots SL3 and SL7 increase, thereby increasing the amount of air passing through the slots SL3 and SL7, and the volumes of the divided regions corresponding to the slots SL2, SL4, SL6, and SL9 decrease, thereby decreasing the amount of air passing through the slots SL2, SL4, SL6, and SL9.

Further, the arrangement at the bottom of FIG. 31 is an example of a combination of the division plates 20, 21, 22, 30, and 31. In comparison with the volumes of the divided regions corresponding to the slots SL1 and SL5, the volumes of the divided regions corresponding to the slots SL3, SL7, and SL9 increase, thereby increasing the amount of air passing through the slots SL3, SL7, and SL9, and the volumes of the divided regions corresponding to the slots SL2, SL4, SL6, and SL8 decrease, thereby decreasing the amount of air passing through the slots SL2, SL4, SL6, and SL8.

Subsequently, a third embodiment of the cooling structure for the housing device will be described.

In the second embodiment described above, a variation is made in the volumes of the divided regions corresponding to the respective slots in the baffle section 12 to equalize (or optimize) the amount of air passing through the slots. In view of the amount of passing air in the individual slots, however, air flows better on the rear side, having a longer distance from the opening to the top plate of the baffle section 12, than on the front side, having a shorter distance from the opening to the top plate, and therefore variability may occur in the amount of passing air within the same slot. Accordingly, in the third embodiment, there is described an application example that a new twist is further added to the shape of the division plate to reduce (equalize) the difference in the amount of passing air within a slot.

FIG. 32 is a diagram illustrating an example of a concrete shape of the division plate in the third embodiment. Other components of the third embodiment other than the division plate are the same as in the first embodiment described above, and therefore the description of the components will be omitted here.

In FIG. 32, a division plate 23 has a cross section in the front view, which is the same in the shape as the division plate 21 of the second embodiment illustrated in the above FIG. 24 (A-A cross section), and the cross section in the rear view, which is the same in the shape as the division plate 20 of the first embodiment illustrated in the above FIG. 11 (B-B cross section). The division plate 23 is the same as the division plates of the first and second embodiments in that the length of one side corresponding to the base in the side view is equal to the depth D of the slot and that the upper side facing the base inclines along the inclination of the top plate of the baffle section 12. The same variation can be made with respect to the above division plate 23 as in the case of the division plates 30 and 31 having the L-shaped cross section illustrated in the above FIGS. 22 and 29. FIG. 33 illustrates the shape of a division plate 33 corresponding to the variation.

In the division plates 23 and 33 having the shapes as described above, the inside volume of the portion located on the front side increases in comparison with the division plates 20 and 30 in the first embodiment. In other words, the division plates 23 and 33 each have a higher percentage of the volume on the front side than in the case of the division plates 20 and 30, with respect to the volume distribution in the depth direction. Therefore, the amount of passing air on the front side relatively increases in the slot under each of the division plates 23 and 33. This reduces the variability in the amount of passing air within the corresponding slot as described above, thereby enabling equalization of the amount of passing air within the same slot.

To achieve the equalization of the amount of passing air among slots or within a slot by making differences in the volume among the divided regions corresponding to the slots in the baffle section 12 as in the second and third embodiments described above, the cooling structure is preferably formed so that the division plates fixed to the top plate of the baffle section 12 or to the housing 11 are easily replaceable to enable flexible selection of the division plates each having a shape appropriate for the conditions of the individual slots.

FIGS. 34 and 35 are diagrams illustrating an example of a structure for fixing the division plate 30 having the L-shaped cross section, for example, illustrated in the above FIG. 22 to the top plate of the baffle section 12 so as to be easily replaceable. In this structural example, the top plate of the baffle section 12 has a rail 12A and a snap-fit connection hole 12B for guiding the division plate 30 to a predetermined position in the location corresponding to the opening of each slot (at the top and in the middle of FIG. 34). Moreover, the division plate 30 has a projecting snap-fit portion 30A at the tip of the top surface along the top plate of the baffle section 12, the tip being located on the rear side of the housing device (at the top and at the bottom of FIG. 34).

The rail 12A is fixed to the top plate of the baffle section 12, for example, by a screw, a rivet, or welding. The top surface of the division plate 30 is inserted into a gap formed between the rail 12A and the lower surface of the top plate (in the middle of FIG. 34) from the rear side of the housing device. The inserted division plate 30 is guided into the inside of the baffle section 12 along the rail 12A (at the top of FIG. 34). Upon the insertion of the division plate 30 up to the end of the baffle section 12, the tip of the snap-fit portion 30A engages with the snap-fit connection hole 12B in the top plate, by which the division plate 30 is fixed in the predetermined position in the baffle section 12 (FIG. 35). To replace the division plate 30, push down on the tip of the snap-fit portion 30A from above the snap-fit connection hole 12B and pull out the division plate 30 in the rear direction of the housing device.

FIG. 36 illustrates an example that the division plates 30 and division plates 31 and 32 each having the similar L-shaped cross section are attached to the top plate of the baffle section 12 by using the fixing structure as described above. In this manner, the rails 12A on the top plate are placed at regular intervals corresponding to the respective slot widths W, and the division plates 30 to 32 of different shapes are able be appropriately selected and attached. This enables easy attachment and replacement of the division plates 30 to 32 appropriate for the structure of the slots or for the conditions of the PIUs mounted in the slots, thereby enabling flexible control of the amount of air passing through the slots.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling structure comprising:
   a housing in which a plurality of slots are arranged in parallel;
   an exhaust induction section adapted to induce a flow of cooling air, having passed through each of the plurality of slots in a first direction and being released from openings located at one end of the respective slots, to a second direction different from the first direction to discharge the cooling air from an air outlet of a housing device; and
   a division section adapted to divide the space inside the exhaust induction section into a plurality of regions corresponding to the openings of the slots, respectively,
   wherein the cooling air released from the openings of the slots passes through the corresponding regions among the plurality of regions obtained by the division section and is discharged from the air outlet.

2. The cooling structure according to claim 1, wherein the division section is adapted to divide the space inside the exhaust induction section so that the respective divided regions have volumes different from one another according to differences in the amount of passing air among the slots.

3. The cooling structure according to claim 1, wherein the division section is adapted to divide the space inside the exhaust induction section so that a volume distribution in a direction perpendicular to the first direction in the divided regions corresponding to the slots varies according to a difference in the amount of passing air in the direction perpendicular to the first direction within one slot.

4. The cooling structure according to claim 1, further comprising a fan motor section adapted to supply the cooling air in a pushing manner to the slots, the fan motor section being arranged between an air inlet of the housing device and the slots.

5. The cooling structure according to claim 4, wherein:
   the fan motor section has a plurality of fan motors; and
   the cooling structure further comprises an air plenum section arranged between the fan motor section and the slots, so that, upon disabling of a part of the fan motors in the fan motor section, the air plenum section enables the cooling air from remaining fan motors to be supplied to the slots located above the fan motors.

6. The cooling structure according to claim 1, further comprising a back wiring board put in a backboard portion of the housing, the back wiring board including a plurality of connectors arranged in parallel in which the plug-in units are mountable,
   wherein the slots are arranged in the housing so as to correspond to the arrangement of the connectors on the back wiring board.

7. The cooling structure according to claim 1, wherein:
   the housing has the openings of the slots in the top surface;
   the exhaust induction section is attached so as to cover the upper part of the housing and has a top plate inclined relative to the first direction; and
   the division section includes a plurality of division plates fixed to the top plate.

8. The cooling structure according to claim 1, wherein:
   the housing has the openings of the slots in the top surface;
   the exhaust induction section is attached so as to cover the upper part of the housing and has a top plate inclined relative to the first direction; and
   the division section includes a plurality of division plates fixed to the top surface of the housing.

9. The cooling structure according to claim 1, wherein the division section includes a plurality of division plates each having a substantially U-shaped cross section perpendicular to the second direction.

10. The cooling structure according to claim 1, wherein the division section includes a plurality of division plates each having a substantially L-shaped cross section perpendicular to the second direction.

11. The cooling structure according to claim 1, wherein the first direction is oriented from the lower side to the upper side of the housing device and the second direction is oriented to one of the front and rear of the housing device.

12. The cooling structure according to claim 1, wherein the exhaust induction section and the housing are formed as an integral structure.

13. The cooling structure according to claim 1, wherein the exhaust induction section and the housing are separated from each other in structure.

14. A housing device comprising:
   a housing in which a plurality of slots are arranged in parallel;
   an exhaust induction section adapted to induce a flow of cooling air, having passed through each of the plurality of slots in a first direction and being released from openings located at one end of the respective slots, to a second direction different from the first direction to discharge the cooling air from an air outlet; and
   a division section adapted to divide the space inside the exhaust induction section into a plurality of regions corresponding to the openings of the slots, respectively,
   wherein the cooling air released from the openings of the slots passes through the corresponding regions among the plurality of regions obtained by the division section and is discharged from the air outlet.

* * * * *